(12) United States Patent
Kang et al.

(10) Patent No.: US 11,569,344 B2
(45) Date of Patent: *Jan. 31, 2023

(54) INTEGRATED CIRCUIT DEVICES AND METHODS OF MANUFACTURING THE SAME

(71) Applicant: Samsung Electronics Co., Ltd., Suwon-si (KR)

(72) Inventors: Jungoo Kang, Seoul (KR); Hyunsuk Lee, Suwon-si (KR); Gihee Cho, Yongin-si (KR); Sanghyuck Ahn, Daegu (KR)

(73) Assignee: Samsung Electronics Co., Ltd.

( * ) Notice: Subject to any disclaimer, the term of this patent is extended or adjusted under 35 U.S.C. 154(b) by 277 days.

This patent is subject to a terminal disclaimer.

(21) Appl. No.: 16/798,826

(22) Filed: Feb. 24, 2020

(65) Prior Publication Data
US 2020/0395438 A1    Dec. 17, 2020

(30) Foreign Application Priority Data

Jun. 11, 2019 (KR) .................. 10-2019-0068805

(51) Int. Cl.
*H01L 49/02* (2006.01)
*H01G 4/12* (2006.01)
*H01L 23/522* (2006.01)

(52) U.S. Cl.
CPC ........... *H01L 28/91* (2013.01); *H01G 4/1254* (2013.01); *H01L 23/5222* (2013.01); *H01L 28/56* (2013.01); *H01L 2221/1084* (2013.01); *H01L 2221/1089* (2013.01)

(58) Field of Classification Search
CPC ......... H01L 27/10805; H01L 27/10847; H01L 28/40; H01L 28/56; H01L 28/75; H01L 28/91; H01L 2221/1084; H01L 2221/1089; H01L 27/1085; H01L 27/10823; H01L 27/10808; H01L 27/10814; H01G 4/1254
See application file for complete search history.

(56) References Cited

U.S. PATENT DOCUMENTS

| | | |
|---|---|---|
| 4,937,650 A | 6/1990 | Shinriki et al. |
| 6,075,691 A | 6/2000 | Duenas et al. |
| 8,564,094 B2 | 10/2013 | Hu |
| 9,716,094 B2 | 7/2017 | Kang et al. |
| 11,031,460 B2 * | 6/2021 | Kang ............... H01L 27/10808 |
| 2008/0272421 A1 | 11/2008 | Bhat |
| 2011/0102968 A1 * | 5/2011 | Choi ................ H01L 29/40117 427/79 |

(Continued)

*Primary Examiner* — Jose R Diaz
(74) *Attorney, Agent, or Firm* — Myers Bigel, P.A.

(57) ABSTRACT

An integrated circuit device includes a capacitor structure, wherein the capacitor structure includes: a bottom electrode over a substrate; a supporter on a sidewall of the bottom electrode; a dielectric layer on the bottom electrode and the supporter; and a top electrode on the dielectric layer and covering the bottom electrode. The bottom electrode comprises: a base electrode layer over the substrate and extending in a first direction that is perpendicular to a top surface of the substrate, and a conductive capping layer including niobium nitride that is between a sidewall of the base electrode layer and the dielectric layer, and also between a top surface of the base electrode layer and the dielectric layer.

18 Claims, 41 Drawing Sheets

(56) References Cited

U.S. PATENT DOCUMENTS

2012/0264271 A1* 10/2012 Kuh .................. H01L 27/10817
                                                    257/E21.011
2017/0152277 A1    6/2017 Lim et al.
2019/0355806 A1   11/2019 Kang et al.

* cited by examiner

A1 – A1'

A1 – A1'

A1 - A1'

A1 - A1'

INTEGRATED CIRCUIT DEVICES AND METHODS OF MANUFACTURING THE SAME

CROSS-REFERENCE TO RELATED APPLICATION

This application claims the benefit of Korean Patent Application No. 10-2019-0068805, filed on Jun. 11, 2019, in the Korean Intellectual Property Office, the disclosure of which is incorporated by reference herein in its entirety.

TECHNICAL FIELD

The present disclosure relates to an integrated circuit device and a method of manufacturing the integrated circuit device, and more particularly, to an integrated circuit device including a capacitor structure and to a method of manufacturing the integrated circuit device.

BACKGROUND

Along with the downscaling of integrated circuit devices, the sizes of capacitor structures of dynamic random access memory (DRAM) devices have also been reduced. As the sizes of capacitor structures have been reduced, methods of forming capacitor dielectric layers in crystal phases having high dielectric constants have been proposed to increase the capacitance of the capacitor structures. However, because aspect ratios of bottom electrodes also have been increased along with the decrease in the sizes of capacitor structures, voids or seams may be formed inside conductive layers of bottom electrodes during formation of the conductive layers, and such voids and seams may contribute to deterioration in electrical performance of DRAM devices.

SUMMARY

The present disclosure provides an integrated circuit device including a capacitor structure, which includes a capacitor dielectric layer having a relatively high dielectric constant even while including a bottom electrode free from voids or seams.

The present disclosure also provides a method of manufacturing an integrated circuit device, the method allowing a bottom electrode free from voids or seams to be formed and allowing a capacitor dielectric layer having a relatively high dielectric constant to be formed.

According to some aspects of the inventive concepts, there is provided an integrated circuit device including a capacitor structure, wherein the capacitor structure includes: a bottom electrode over a substrate; a supporter on a sidewall of the bottom electrode; a dielectric layer on the bottom electrode and the supporter; and a top electrode on the dielectric layer and covering the bottom electrode. The bottom electrode includes: a base electrode layer over the substrate and extending in a first direction that is perpendicular to a top surface of the substrate; and a conductive capping layer including niobium nitride and between a sidewall of the base electrode layer and the dielectric layer, and also between a top surface of the base electrode layer and the dielectric layer.

According to some aspects of the inventive concepts, there is provided an integrated circuit device including a capacitor structure, wherein the capacitor structure includes: a bottom electrode over a substrate; a supporter on a sidewall of the bottom electrode; a dielectric layer on the bottom electrode and the supporter; and a top electrode on the dielectric layer and covering the bottom electrode. The bottom electrode includes: a base electrode layer that comprises niobium nitride and that is over the substrate and extending in a first direction that is perpendicular to a top surface of the substrate; and a first seed layer surrounded by the supporter and in contact with at least a portion of the base electrode layer.

According to some aspects of the inventive concepts, there is provided an integrated circuit device including a capacitor structure, wherein the capacitor structure includes: a landing pad over a substrate; a bottom electrode on the landing pad; a supporter on a sidewall of the bottom electrode; a dielectric layer on the bottom electrode and the supporter; and a top electrode on the dielectric layer to cover the bottom electrode. The bottom electrode includes a base electrode layer including niobium nitride that is over the substrate and that extends in a first direction that is perpendicular to a top surface of the substrate. A portion of the dielectric layer in contact with the base electrode layer includes hafnium oxide having a tetragonal crystal phase, and a bottom surface of the bottom electrode is contact with a top surface of the landing pad.

According to some aspects of the inventive concepts, there is provided a method of manufacturing an integrated circuit device, the method including: forming a landing pad over a substrate; forming a mold structure on the landing pad, the landing pad including an opening that exposes a top surface of the landing pad; and forming a base electrode layer within the opening, the base electrode layer including niobium nitride, wherein the forming of the base electrode layer includes selectively depositing the base electrode layer on the top surface of the landing pad, relative to a sidewall of the mold structure.

BRIEF DESCRIPTION OF THE DRAWINGS

Aspects of the present disclosure will be more clearly understood from the following detailed description taken in conjunction with the accompanying drawings in which.

DETAILED DESCRIPTION

Hereinafter, some embodiments of the inventive concepts will be described in detail with reference to the accompanying drawings.

Figure 1:
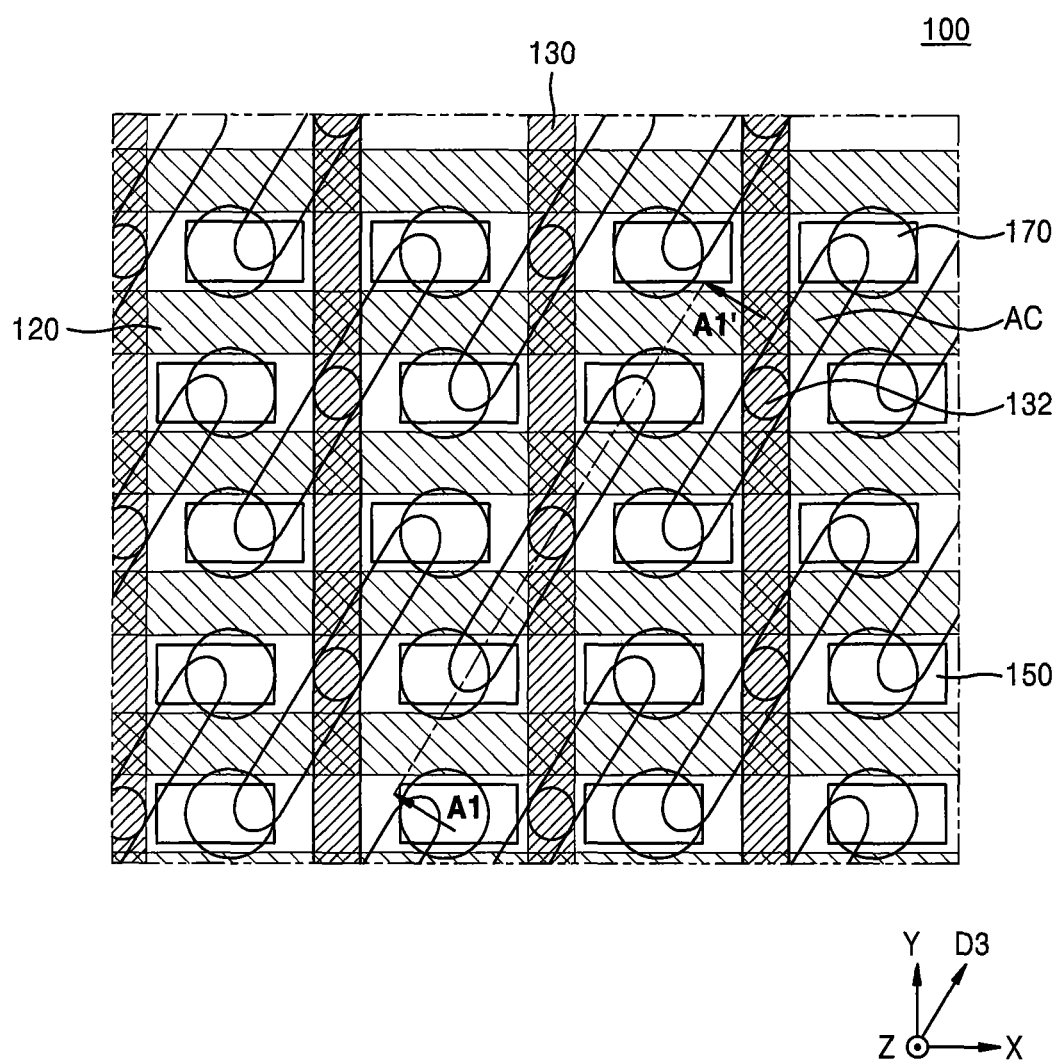
FIG. 1 is a layout diagram illustrating an integrated circuit device according to some embodiments.
Figure 2:
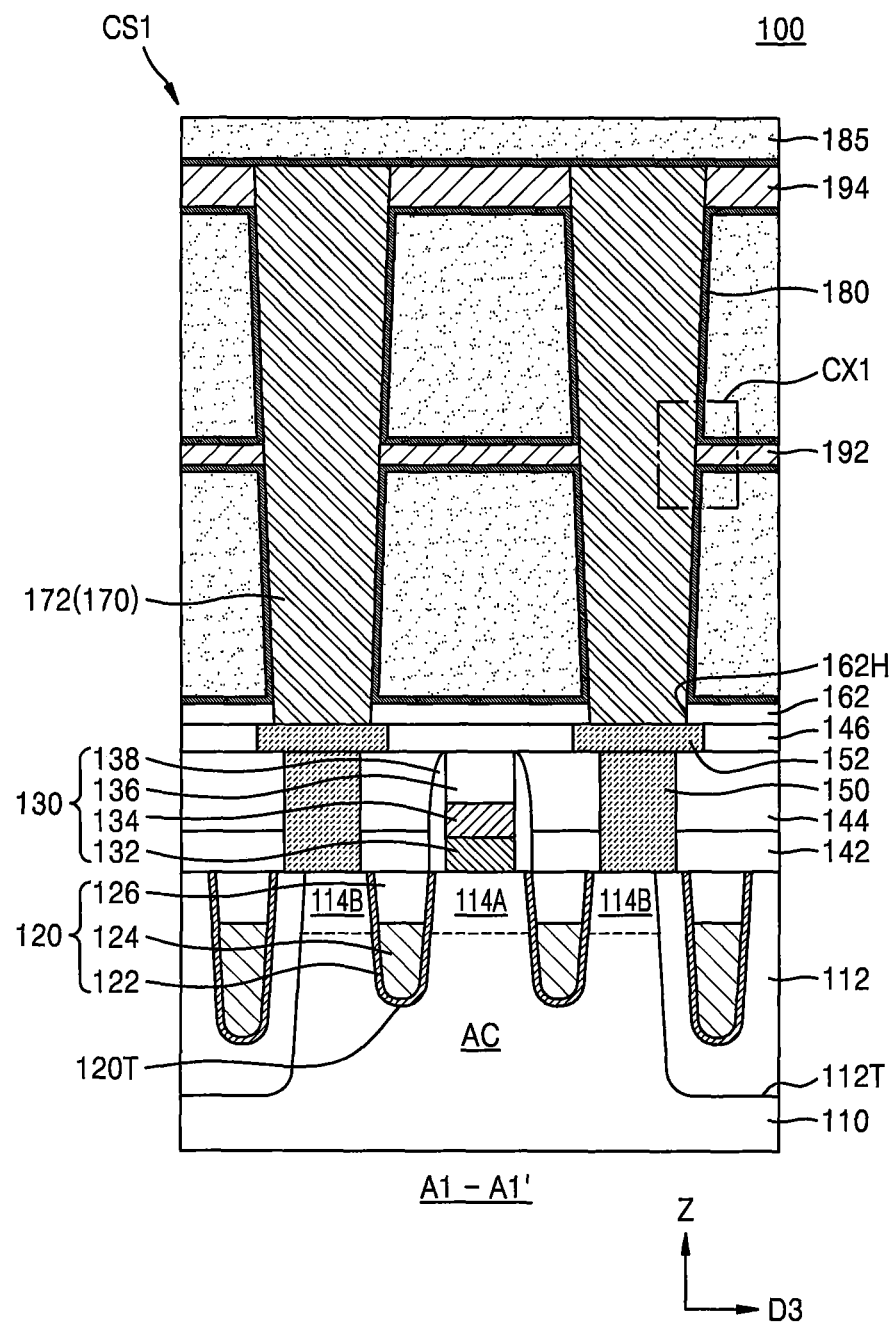
FIG. 2 is a cross-sectional view taken along a line A1-A1' of FIG. 1.
Figure 3:
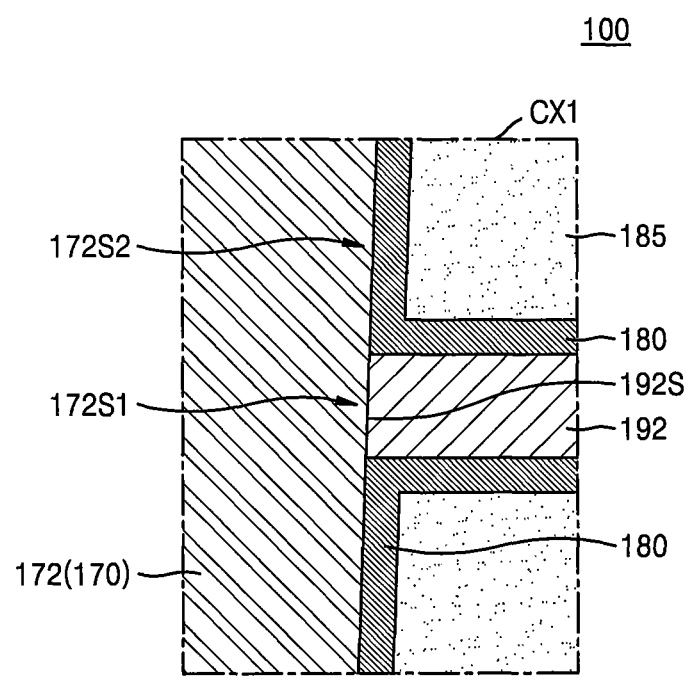
FIG. 3 is an enlarged view of an area CX1 of FIG. 2.

FIG. 1 is a layout diagram illustrating an integrated circuit device 100 according to some embodiments. FIG. 2 is a cross-sectional view taken along a line A1-A1' of FIG. 1. FIG. 3 is an enlarged view of an area CX1 of FIG. 2.

Referring to FIGS. 1 to 3, a substrate 110 may include an active region AC defined by a device isolation film 112. In example embodiments, the substrate 110 may include a semiconductor material such as silicon (Si), germanium (Ge), silicon-germanium (SiGe), silicon carbide (SiC), gallium arsenide (GaAs), indium arsenide (InAs), or indium phosphide (InP). In example embodiments, the substrate 110 may include a conductive region, for example, an impurity-doped well, or an impurity-doped structure.

The device isolation film 112 may have a shallow trench isolation (STI) structure. For example, the device isolation film 112 may include an insulating material filling a device isolation trench 112T, which is formed in the substrate 110. The insulating material may include fluoride silicate glass (FSG), undoped silicate glass (USG), borophosphosilicate glass (BPSG), phosphosilicate glass (PSG), flowable oxide (FOX), plasma enhanced tetraethyl orthosilicate (PE-TEOS), or tonen silazene (TOSZ), although the present disclosure is not limited thereto.

The active region AC may have a relatively long island shape having a short axis and a long axis. As shown as an example in FIG. 1, the long axis of the active region AC may be arranged in a D3 direction that is parallel to a top surface of the substrate 110. In example embodiments, the active region AC may be doped with P-type or N-type impurities.

The substrate 110 may further include a gate line trench 120T extending in an X direction that is parallel to the top surface of the substrate 110. The gate line trench 120T may cross the active region AC and may have a certain depth from the top surface of the substrate 110. A portion of the gate line trench 120T may extend into the device isolation film 112, and the portion of the gate line trench 120T formed in the device isolation film 112 may have a bottom surface at a level that is lower than that of a portion of the gate line trench 120T formed in the active region AC.

A first source/drain region 114A and a second source/drain region 114B may be respectively arranged in upper portions of the active region AC located at both sides of the gate line trench 120T. The first source/drain region 114A and the second source/drain region 114B may be impurity regions doped with impurities having a different conductivity type from that of impurities doped into the active region AC. The first source/drain region 114A and the second source/drain region 114B may be doped with N-type or P-type impurities.

A gate structure 120 may be formed in the gate line trench 120T. The gate structure 120 may include a gate insulating layer 122, a gate electrode 124, and a gate capping layer 126, which may be sequentially formed on an, inner wall of the gate line trench 120T in this stated order.

The gate insulating layer 122 may be formed to a certain thickness on the inner wall of the gate line trench 120T. The gate insulating layer 122 may include at least one selected from the group consisting of silicon oxide, silicon nitride, silicon oxynitride, oxide/nitride/oxide (ONO), and a high-k dielectric material having a higher dielectric constant than that of silicon oxide. For example, the gate insulating layer 122 may have a dielectric constant of about 10 to about 25. In some embodiments, the gate insulating layer 122 may include hafnium dioxide ($HfO_2$), zirconium dioxide ($ZrO_2$), aluminum oxide ($Al_2O_3$), $HfAlO_3$, tantalum oxide ($Ta_2O_3$), titanium dioxide ($TiO_2$), or a combination thereof, although the present disclosure is not limited thereto.

The gate electrode 124 may be formed on the gate insulating layer 122 to fill the gate line trench 120T to a certain height from the bottom of the gate line trench 120T. The gate electrode 124 may include a work function adjusting layer (not shown) on the gate insulating layer 122, and a gap-fill metal layer (not shown) arranged on the work function adjusting layer to fill a bottom portion of the gate line trench 120T. For example, the work function adjusting layer may include a metal, a metal nitride, or a metal carbide, such as titanium (Ti), titanium nitride (TiN), titanium aluminum nitride (TiAlN), titanium aluminum carbide (TiAlC), TiAlCN, TiSiCN, tantalum (Ta), tantalum nitride (TaN), tantalum aluminum nitride (TaAlN), TaAlCN, TaSiCN, or the like, and the gap-fill metal layer may include at least one selected from the group consisting of tungsten (W), tungsten nitride (WN), TiN, and TaN.

The gate capping layer 126 may be arranged on the gate electrode 124 to fill the remaining portion of the gate line trench 120T. The gate capping layer 126 may include at least one selected from the group consisting of silicon oxide, silicon oxynitride, and silicon nitride, as examples.

A bit line structure 130 may be formed on the first source/drain region 114A to extend in a Y direction that is parallel to the top surface of the substrate 110 and perpendicular to the X direction. The bit line structure 130 may include a bit line contact 132, a bit line 134, and a bit line capping layer 136, which may be sequentially stacked on the substrate 110 in this stated order. The bit line structure 130 may also include a bit line spacer 138, which may contact sidewalls of the bit line contact 132, the bit line 134, and the bit line capping layer 136. The bit line contact 132 may include polysilicon and the bit line 134 may include a metal material, as examples. The bit line capping layer 136 may include an insulating material such as silicon nitride or silicon oxynitride, as examples. The bit line spacer 138 may have a single-layer or multi-layer structure including an insulating material such as silicon oxide, silicon oxynitride, or silicon nitride, as examples. In some embodiments, the bit line spacer 138 may further include an air space (not shown). Optionally, a bit line intermediate layer (not shown) may be arranged between the bit line contact 132 and the bit line 134. The bit line intermediate layer, if present, may include a metal silicide such as tungsten silicide, or a metal nitride such as tungsten nitride, as examples.

Although FIG. 2 illustrates an example in which the bit line contact 132 has a bottom surface at a level that is equal to that of the top surface of the substrate 110, in some embodiments, a recess (not shown) may be formed in the substrate 110, which may extend to a certain depth from the top surface of the substrate 110. The bit line contact 132 may extend into the recess, such that the bottom surface of the bit line contact 132 may be at a lower level than the top surface of the substrate 110.

A first insulating layer 142 and a second insulating layer 144 may be sequentially arranged on the substrate 110 in this stated order. In some embodiments, the bit line structure 130 may be arranged on the first source/drain region 114A and may extend through the first insulating layer 142 and the second insulating layer 144.

A capacitor contact 150 may be arranged on the second source/drain region 114B. An outer sidewall of the capacitor contact 150 may be surrounded by the first and second insulating layers 142 and 144. In some embodiments, the capacitor contact 150 may include a lower contact pattern (not shown), a metal silicide layer (not shown), and an upper contact pattern (not shown), which are sequentially stacked on the substrate 110 in this stated order, and may include a barrier layer (not shown) on a side surface and a bottom surface of the upper contact pattern. In some embodiments, the lower contact pattern may include polysilicon and the upper contact pattern may include a metal material. The barrier layer may include a metal nitride having conductivity.

A third insulating layer 146 may be arranged on the second insulating layer 144, and a landing pad 152 may be arranged to be connected to the capacitor contact 150 through the third insulating layer 146. As shown in FIG. 2, the landing pad 152 may vertically overlap the capacitor contact 150 and may have a width that is greater than that of the capacitor contact 150. As such, in some embodiments the landing pad 152 may completely overlap the capacitor contact 150. In some embodiments, the landing pad 152 may include at least one selected from the group consisting of metals such as ruthenium (Ru), titanium (Ti), tantalum (Ta), niobium (Nb), iridium (Ir), molybdenum (Mo), and tungsten (W) and conductive metal nitrides such as titanium nitride (TiN), tantalum nitride (TaN), niobium nitride (NbN), molybdenum nitride (MoN), and tungsten nitride (WN). In some examples, the landing pad 152 may include titanium nitride (TiN).

An etch stop layer 162 may be formed on the landing pad 152 and the third insulating layer 146. The etch stop layer 162 may include an opening 162H exposing a top surface of the landing pad 152.

A capacitor structure CS1 may be arranged on the etch stop layer 162. The capacitor structure CS1 may include a bottom electrode 170, which is electrically connected to the capacitor contact 150 with the landing pad 152 therebetween, a dielectric layer 180, which covers portions of a sidewall and upper surface of the bottom electrode 170, and a top electrode 185 on the dielectric layer 180.

The bottom electrode 170 may be arranged on the landing pad 152, and a bottom portion of the bottom electrode 170 may be arranged in the opening 162H of the etch stop layer 162. The width of the bottom portion of the bottom electrode 170 may be less than the width of the landing pad 152, and thus, an entire bottom surface of the bottom electrode 170 may contact the landing pad 152.

For example, as shown in FIG. 2, the bottom electrode 170 may have a pillar or column shape extending in a vertical direction (Z direction). As shown in FIG. 1, although the bottom electrode 170 may have a horizontal cross-section having a circular shape, the present disclosure is not limited thereto. In some embodiments, the horizontal cross-section of the bottom electrode 170 may have various polygonal and rounded-polygonal shapes, such as ellipses, quadrangles, rounded quadrangles, rhombuses, trapezoids, and the like.

As shown in FIG. 1, the bottom electrode 170 and the capacitor contact 150 may be repeatedly arranged in a first direction (X direction) and a second direction (Y direction). In addition, although not shown in FIG. 1, landing pads 152 may be arranged, in a matrix form, apart from each other in the first direction (X direction) and the second direction (Y direction) while respectively and vertically overlapping bottom electrodes 170.

In some embodiments, and different from what is shown in FIG. 1, the capacitor contact 150 may be repeatedly arranged in the first direction (X direction) and the second direction (Y direction), and the bottom electrodes 170 may be arranged in a hexagonal shape such as a honeycomb structure. In such embodiments, the landing pad 152 may vertically and completely overlap the bottom electrode 170 while vertically overlapping a portion of the capacitor contact 150.

The bottom electrode 170 may include a base electrode layer 172. The base electrode layer 172 may include at least one selected from the group consisting of metals such as ruthenium (Ru), titanium (Ti), tantalum (Ta), niobium (Nb), iridium (Ir), molybdenum (Mo), and tungsten (W), conductive metal nitrides such as titanium nitride (TiN), tantalum nitride (TaN), niobium nitride (NbN), molybdenum nitride (MoN), and tungsten nitride (WN), and conductive metal oxides such as iridium oxide ($IrO_2$), ruthenium oxide ($RuO_2$), and strontium ruthenium oxide ($SrRuO_3$). In some embodiments, the base electrode layer 172 may include niobium nitride.

In some embodiments, the base electrode layer 172 may not include voids or seams therein. In other words, the base electrode layer 172 may be free of voids or seams. In some embodiments, the presence of voids and seams in the base electrode layer 172 may be reduced. For example, the base electrode layer 172 may be formed by a manufacturing process described with reference to FIG. 16. For example, the base electrode layer 172 may be formed by filling an opening 210H of a mold structure 210 in a bottom-up filling manner by using the top surface of the landing pad 152 as a seed layer. As the base electrode layer 172 is formed in the bottom-up filling manner, the base electrode layer 172 may not include voids or seams therein.

A first supporter 192 and a second supporter 194 may be arranged apart from each other on a sidewall of the bottom electrode 170. In other words, the first supporter 192 and the second supporter 194 may be spaced apart from each other in the Z direction, as seen in FIG. 2. The bottom electrode 170 may include a first sidewall 172S1 and a second sidewall 172S2, and the first sidewall 172S1 may be surrounded by the first supporter 192 and the second supporter 194. For example, as shown in FIG. 3, the first sidewall 172S1 of the bottom electrode 170 may contact a sidewall 192S of the first supporter 192. The first sidewall 172S1 and the second sidewall 172S2 may be coplanar and aligned with each other.

The first supporter 192 and the second supporter 194 are arranged between a first bottom electrode 170 and a second bottom electrode 170 adjacent thereto, and may function as support members preventing the bottom electrode 170 from falling down or collapsing during a process of removing the mold structure 210 (see FIG. 17) or a process of forming the dielectric layer 180. Each of the first supporter 192 and the second supporter 194 may include silicon nitride, silicon oxynitride, silicon boron nitride (SiBN), or silicon carbon nitride (SiCN).

The second supporter 194 may have a top surface at a level that is equal to that of the top surface of the bottom electrode 170, and the first supporter 192 may be arranged at a lower level than the second supporter 194 with reference to the top surface of the substrate 110. Although FIG. 2 illustrates that one first supporter 192 and one second supporter 194 are formed on the sidewall of the bottom electrode 170, the number of each of the first supporter 192 and the second supporter 194 may vary. For example, in some embodiments, a plurality of first supporters 192 may be formed and arranged apart from each other by a substantially equal separation distance in the vertical direction.

The dielectric layer 180 may be arranged on the sidewall and the top surface of the bottom electrode 170. In some embodiments, the dielectric layer 180 may be arranged on the second sidewall 172S2 of the bottom electrode 170. The dielectric layer 180 may extend from the sidewall of the bottom electrode 170 onto top surfaces and bottom surfaces of the first and second supporters 192 and 194 and may also be arranged on the etch stop layer 162. The dielectric layer 180 may have a thickness T11 of about 20 Å to about 100 Å in a direction that is perpendicular to the top surface of the bottom electrode 170, although the present disclosure is not limited thereto.

In some embodiments, the dielectric layer 180 may include at least one selected from the group consisting of zirconium oxide, hafnium oxide, titanium oxide, niobium oxide, tantalum oxide, yttrium oxide, strontium titanium oxide, barium strontium titanium oxide, scandium oxide, and lanthanide oxides. In some examples, the dielectric layer 180 may include hafnium oxide predominantly having a tetragonal crystal phase. In other examples, the dielectric layer 180 may have a stack structure of a first dielectric layer and a second dielectric layer, and at least one of the first dielectric layer and the second dielectric layer may include hafnium oxide predominantly having a tetragonal crystal phase.

The top electrode 185 may be arranged on the dielectric layer 180, and may cover or substantially cover the bottom electrode 170. The top electrode 185 may include at least one selected from the group consisting of metals such as ruthenium (Ru), titanium (Ti), tantalum (Ta), niobium (Nb), iridium (Ir), molybdenum (Mo), and tungsten (W), conductive metal nitrides such as titanium nitride (TiN), tantalum nitride (TaN), niobium nitride (NbN), molybdenum nitride (MoN), and tungsten nitride (WN), and conductive metal oxides such as iridium oxide ($IrO_2$), ruthenium oxide ($RuO_2$), and strontium ruthenium oxide ($SrRuO_3$).

In some embodiments, the top electrode 185 may include a single material layer or a stack structure of a plurality of material layers. In one example, the top electrode 185 may include a single layer of titanium nitride (TiN) or niobium nitride (NbN). In another example, the top electrode 185 may include a stack structure including a first top electrode layer containing titanium nitride (TiN) and a second top electrode layer containing niobium nitride (NbN).

Optionally, an interfacial layer (not shown) may be further formed between the dielectric layer 180 and the top electrode 185. The interfacial layer may include at least one selected from the group consisting of metal oxides such as titanium oxide, tantalum oxide, niobium oxide, molybdenum oxide, and iridium oxide, and metal oxynitrides such as titanium oxynitride (TiON), tantalum oxynitride (TaON), niobium oxynitride (NbON), and molybdenum oxynitride (MoON).

In example embodiments, the base electrode layer 172 may include niobium nitride, and the dielectric layer 180 contacting the base electrode layer 172 may include hafnium oxide having a tetragonal crystal phase. For example, when the base electrode layer 172 including niobium nitride contacts the dielectric layer 180, the dielectric layer 180 may predominantly have a tetragonal crystal phase rather than a monoclinic crystal phase in a process of forming the dielectric layer 180. Alternatively, in a heat treatment process performed after the process of forming the dielectric layer 180, the dielectric layer 180 may be crystallized to predominantly have a tetragonal crystal phase rather than a monoclinic crystal phase. In this case, the dielectric layer 180 may exhibit crystal peaks originated from hafnium oxide having a tetragonal crystal phase in an X-ray diffraction analysis. The hafnium oxide having a tetragonal crystal phase may have a dielectric constant that is greater than that of hafnium oxide having a monoclinic crystal phase, and thus, the capacitor structure CS1 may have relatively large capacitance.

In general, as an aspect ratio of the bottom electrode 170 increases, voids or seams may be formed in a process of filling the opening 210H with a conductive layer to form the bottom electrode 170, and in this case, the electrical characteristics or reliability of the capacitor structure may be deteriorated. However, according to at least the example embodiments described above, the opening 210H may be filled with a conductive layer by a bottom-up filling method using the landing pad 152 as a seed layer, and the generation of voids or seams inside the bottom electrode 170 may be prevented or reduced due to the bottom-up filling method. Therefore, the capacitor structure CS1 may include the dielectric layer 180 for a capacitor, which has a relatively high dielectric constant, while including the bottom electrode 170, which is free from voids or seams or having a reduced number of voids and seams.

Figure 4:
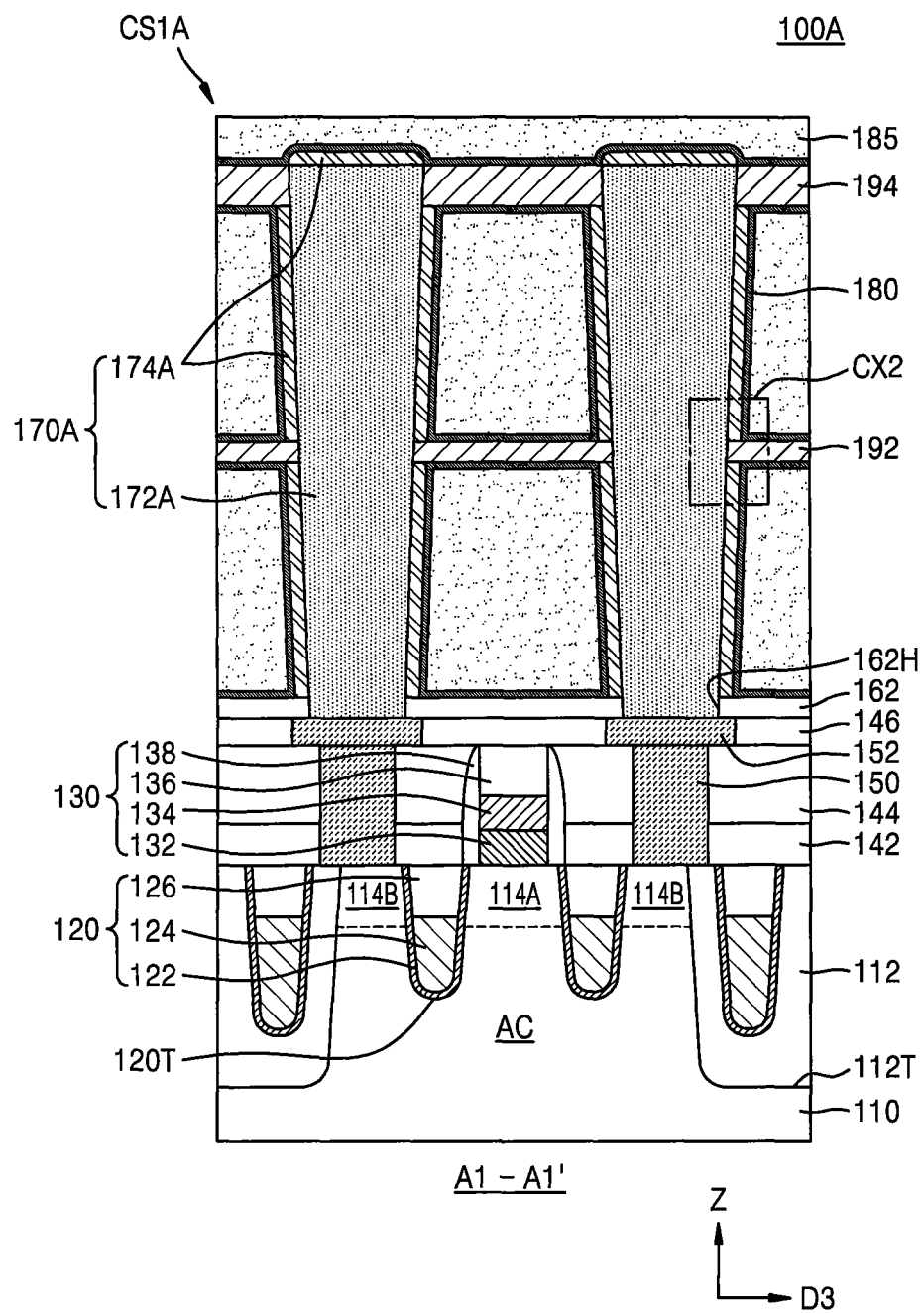
FIG. 4 is a cross-sectional view illustrating an integrated circuit device according to some embodiments.
Figure 5:
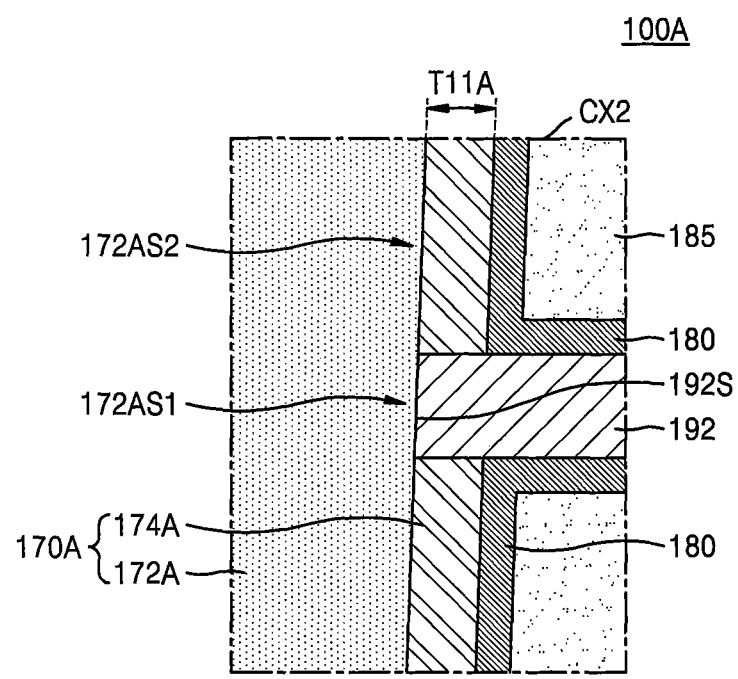
FIG. 5 is an enlarged view of an area CX2 of FIG. 4.

FIG. 4 is a cross-sectional view illustrating an integrated circuit device 100A according to some embodiments. FIG. 5 is an enlarged view of an area CX2 of FIG. 4. In FIGS. 4 and 5, the same reference numerals as in FIGS. 1 to 3 respectively denote the same components.

Referring to FIGS. 4 and 5, a bottom electrode 170A may include a base electrode layer 172A and a conductive capping layer 174A.

A bottom portion of the base electrode layer 172A may be formed in the opening 162H of the etch stop layer 162, and the base electrode layer 172A may have a pillar or column shape extending in the vertical direction (Z direction). The base electrode layer 172A may include at least one selected from the group consisting of metals such as ruthenium (Ru), titanium (Ti), tantalum (Ta), niobium (Nb), iridium (Ir), molybdenum (Mo), and tungsten (W), conductive metal nitrides such as titanium nitride (TiN), tantalum nitride (TaN), niobium nitride (NbN), molybdenum nitride (MoN), and tungsten nitride (WN), and conductive metal oxides such as iridium oxide ($IrO_2$), ruthenium oxide ($RuO_2$), and strontium ruthenium oxide ($SrRuO_3$). In some embodiments, the base electrode layer 172A may include titanium nitride.

The conductive capping layer 174A may be arranged on a sidewall and a top surface of the base electrode layer 172A. The conductive capping layer 174A may be arranged between the base electrode layer 172A and the dielectric layer 180, and thus, the base electrode layer 172A may not directly contact the dielectric layer 180.

In some embodiments, the conductive capping layer 174A may include at least one selected from the group consisting of metals such as ruthenium (Ru), titanium (Ti), tantalum (Ta), niobium (Nb), iridium (Ir), molybdenum (Mo), and tungsten (W), conductive metal nitrides such as titanium nitride (TiN), tantalum nitride (TaN), niobium nitride (NbN), molybdenum nitride (MoN), and tungsten nitride (WN), and conductive metal oxides such as iridium oxide (IrO$_2$), ruthenium oxide (RuO$_2$), and strontium ruthenium oxide (SrRuO$_3$). In some embodiments, the conductive capping layer 174A may include niobium nitride.

The base electrode layer 172A may include a first sidewall 172AS1 and a second sidewall 172AS2. The first sidewall 172AS1 of the base electrode layer 172A may be surrounded by the first supporter 192, and the second sidewall 172AS2 of the base electrode layer 172A may be surrounded by the conductive capping layer 174A. The first sidewall 172AS1 and the second sidewall 172AS2 may be coplanar and aligned with each other. The conductive capping layer 174A may have a first thickness T11A of about 5 Å to about 100 Å in a direction that is perpendicular to the sidewall of the base electrode layer 172A, although the present disclosure is not limited thereto. For example, the conductive capping layer 174A may be formed on the top surface of the base electrode layer 172A by a selective deposition method, and thus, the conductive capping layer 174A may be formed on the second sidewall 172AS2 except on the first sidewall 172AS1 surrounded by the first supporter 192 and the second supporter 194. In addition, the conductive capping layer 174A may not be formed on the etch stop layer 162 and on the top surfaces and the bottom surfaces of the first and second supporters 192 and 194.

In an example manufacturing process, according to a manufacturing process to be described with reference to FIG. 22, the conductive capping layer 174A may be formed on the sidewall and the top surface of the base electrode layer 172A (for example, on the second sidewall 172AS2 and the top surface of the base electrode layer 172A) by a selective deposition method. For example, the conductive capping layer 174A may be selectively formed on a surface of the base electrode layer 172A, relative to a surface of the etch stop layer 162, a surface of the first supporter 192, and a surface of the second supporter 194. Thus, portions of the bottom electrode 170A, which contact the dielectric layer 180, may be the conductive capping layer 174A, and the dielectric layer 180 may not contact the base electrode layer 172A. For example, as the dielectric layer 180 is arranged to contact the conductive capping layer 174A, the dielectric layer 180 may include hafnium oxide having a tetragonal crystal phase. The hafnium oxide having a tetragonal crystal phase may have a dielectric constant that is greater than that of hafnium oxide having a monoclinic crystal phase, and thus, a capacitor structure CS1A may have relatively large capacitance.

Figure 6:
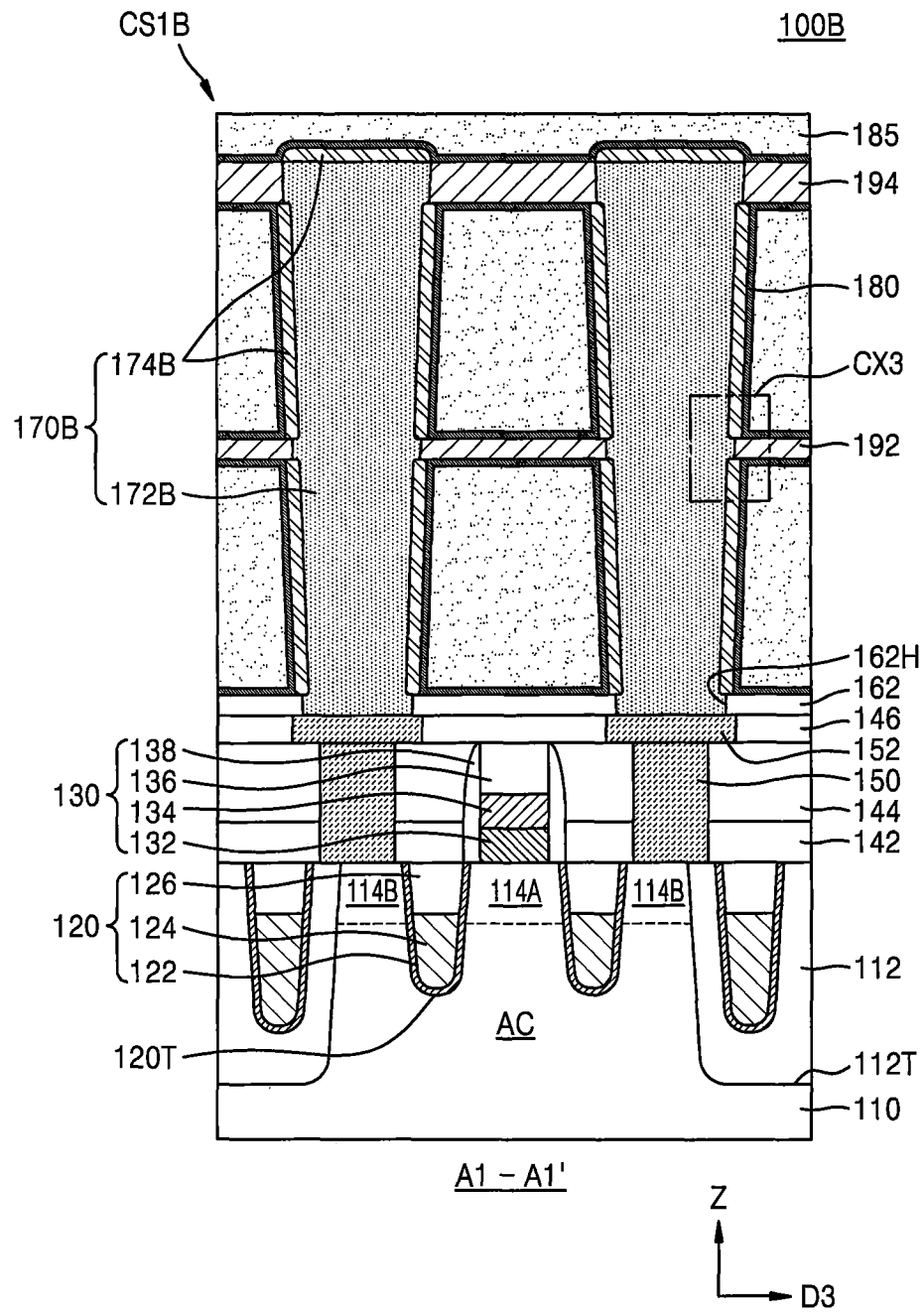
FIG. 6 is a cross-sectional view illustrating an integrated circuit device according to some embodiments.
Figure 7:
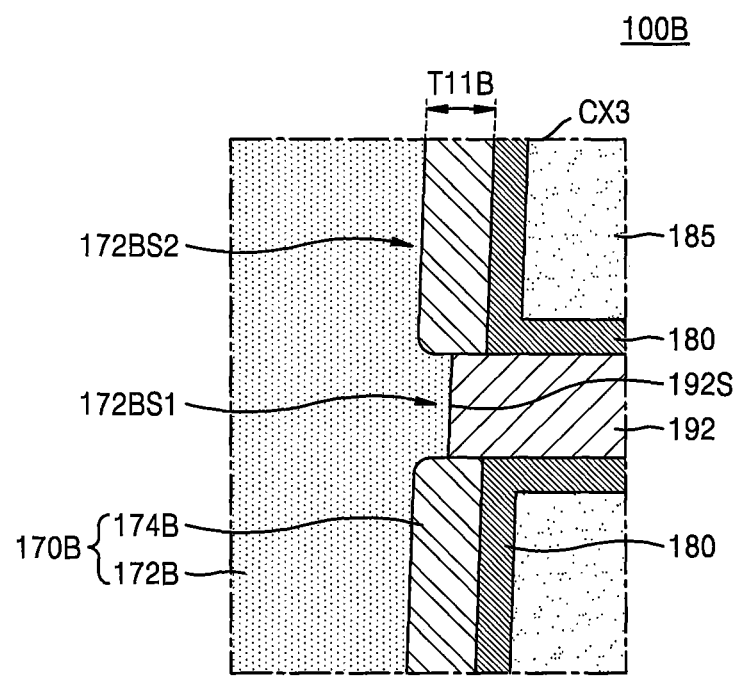
FIG. 7 is an enlarged view of an area CX3 of FIG. 6.

FIG. 6 is a cross-sectional view illustrating an integrated circuit device 100B according to some embodiments. FIG. 7 is an enlarged view of an area CX3 of FIG. 6. In FIGS. 6 and 7, the same reference numerals as in FIGS. 1 to 5 respectively denote the same components.

Referring to FIGS. 6 and 7, a bottom electrode 170B may include a base electrode layer 172B and a conductive capping layer 174B.

The base electrode layer 172B may be formed in the opening 162H of the etch stop layer 162. The conductive capping layer 174B may be arranged on a sidewall and a top surface of the base electrode layer 172B. The conductive capping layer 174B may be arranged between the base electrode layer 172B and the dielectric layer 180, and thus, the base electrode layer 172B may not directly contact the dielectric layer 180.

A first sidewall 172BS1 of the base electrode layer 172B may be surrounded by the first supporter 192, and a second sidewall 172BS2 of the base electrode layer 172B may be surrounded by the conductive capping layer 174B. The second sidewall 172BS2 may be recessed inwards (in a direction toward the center of the base electrode layer 172B) with respect to the first sidewall 172BS1. In addition, the second sidewall 172BS2 may be recessed inwards with respect to the sidewall 192S of the first supporter 192. The conductive capping layer 174B may have a first thickness T11B of about 5 Å to about 100 Å in a direction that is perpendicular to the sidewall of the base electrode layer 172B.

For example, as the dielectric layer 180 is arranged to contact the conductive capping layer 174B, the dielectric layer 180 may include hafnium oxide having a tetragonal crystal phase. For example, the hafnium oxide having a tetragonal crystal phase may have a dielectric constant that is greater than that of hafnium oxide having a monoclinic crystal phase, and thus, a capacitor structure CS1B may have relatively large capacitance.

Figure 8:
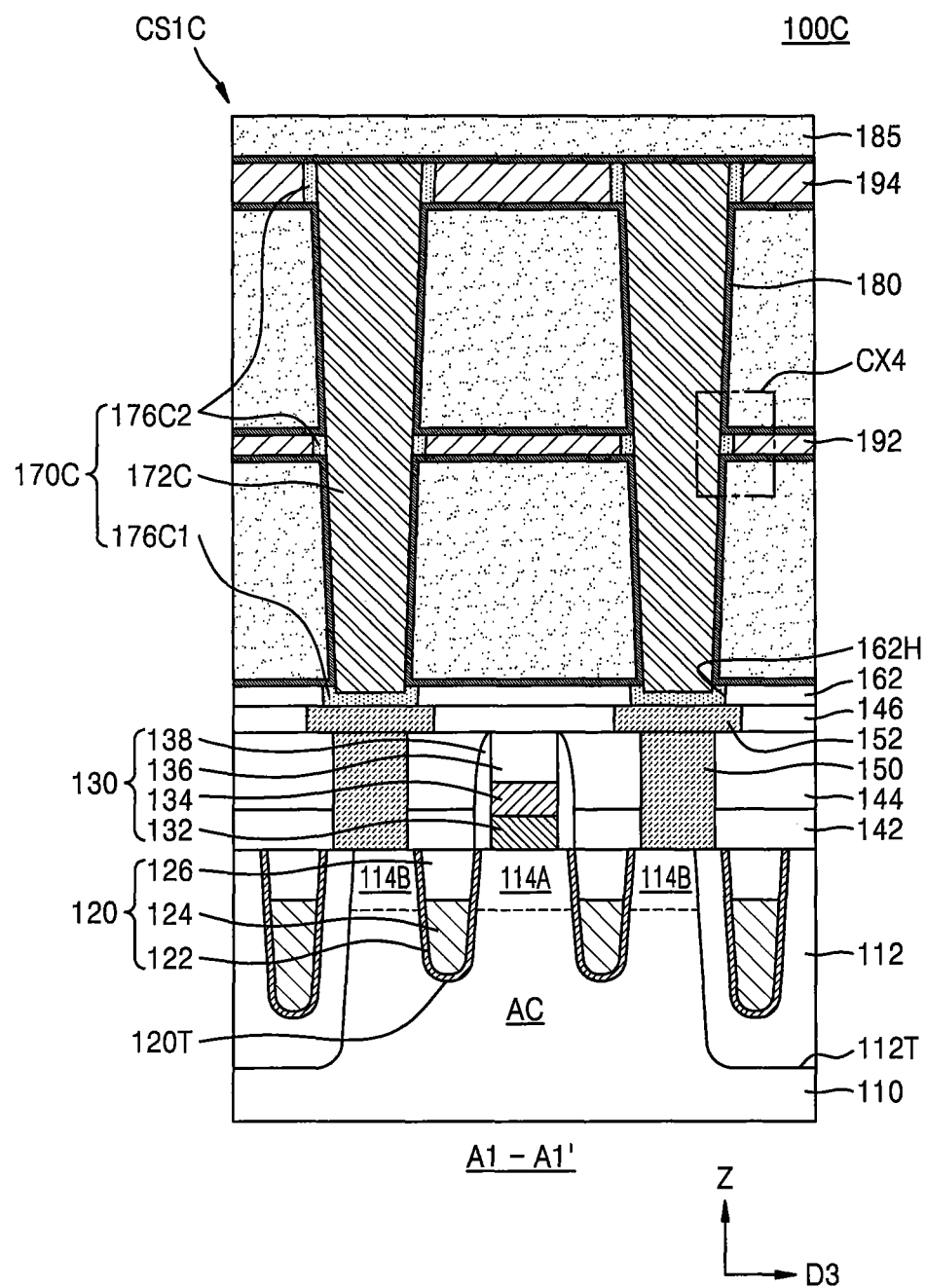
FIG. 8 is a cross-sectional view illustrating an integrated circuit device according to some embodiments.
Figure 9:
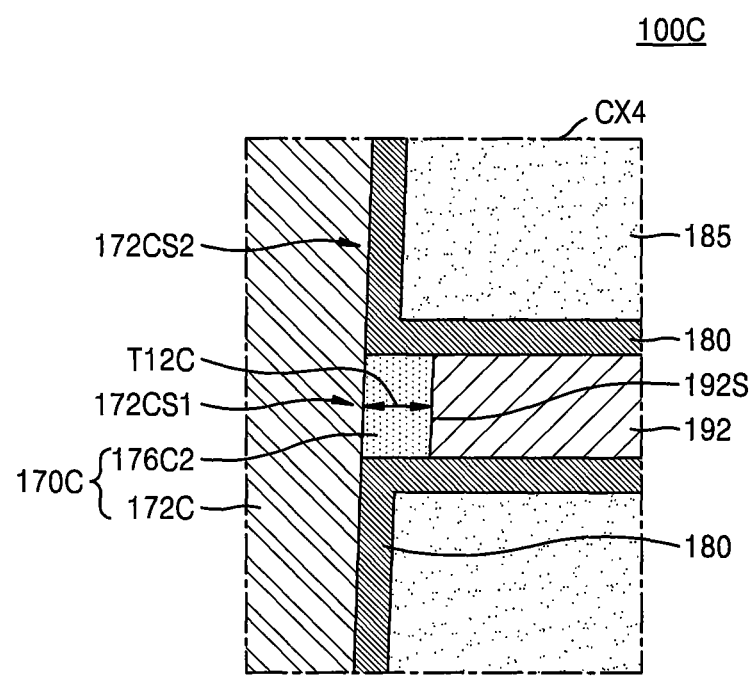
FIG. 9 is an enlarged view of an area CX4 of FIG. 8.

FIG. 8 is a cross-sectional view illustrating an integrated circuit device 100C according to some embodiments. FIG. 9 is an enlarged view of an area CX4 of FIG. 8. In FIGS. 8 and 9, the same reference numerals as in FIGS. 1 to 7 respectively denote the same components.

Referring to FIGS. 8 and 9, a bottom electrode 170C may include a base electrode layer 172C, a first seed layer 176C1, and a second seed layer 176C2.

The base electrode layer 172C may have a pillar or column shape extending in the vertical direction (Z direction), and the first seed layer 176C1 may be arranged between the base electrode layer 172C and the landing pad 152. The first seed layer 176C1 may be formed on an inner wall of the opening 162H of the etch stop layer 162, and a top surface of the first seed layer 176C1 may contact an entire bottom surface of the base electrode layer 172C. The second seed layer 176C2 may be arranged between the first supporter 192 and the base electrode layer 172C and between the second supporter 194 and the base electrode layer 172C.

The base electrode layer 172C may include at least one selected from the group consisting of metals such as ruthenium (Ru), titanium (Ti), tantalum (Ta), niobium (Nb), iridium (Ir), molybdenum (Mo), and tungsten (W), conductive metal nitrides such as titanium nitride (TiN), tantalum nitride (TaN), niobium nitride (NbN), molybdenum nitride (MoN), and tungsten nitride (WN), and conductive metal oxides such as iridium oxide (IrO2), ruthenium oxide (RuO2), and strontium ruthenium oxide (SrRuO3). In some embodiments, the base electrode layer 172C may include niobium nitride. In some embodiments, each of the first seed layer 176C1 and the second seed layer 176C2 may include titanium nitride.

As shown in FIG. 9, the base electrode layer 172C may include a first sidewall 172CS1 and a second sidewall 172CS2. The first sidewall 172CS1 may be surrounded by the second seed layer 176C2 and may not contact the sidewall 192S of the first supporter 192. The second sidewall 172CS2 of the base electrode layer 172C may contact the dielectric layer 180. In some embodiments, the first sidewall 172CS1 and the second sidewall 172CS2 may be coplanar and aligned with each other. In some embodiments, the second sidewall 172CS2 may differ from that shown in FIG. 9 and may be recessed inwards (in a direction toward the center of the base electrode layer 172C) with respect to the first sidewall 172CS1.

The second seed layer 176C2 may have a second thickness T12C of about 5 Å to about 200 Å in a direction that is perpendicular to a sidewall of the base electrode layer 172C, without being limited thereto.

In an example manufacturing process, a preliminary seed layer 176CL (see FIG. 27) may be formed in the opening 210H formed in the mold structure 210, followed by forming the base electrode layer 172C on the preliminary seed layer 176CL by a bottom-up filling method. Next, in a process of removing the mold structure 210, the sidewall of the base electrode layer 172C may be exposed by first and second mold openings 212OP and 214OP by removing the preliminary seed layer 176CL exposed by the first and second mold openings 212OP and 214OP. Next, the dielectric layer 180 may be formed on the sidewall of the base electrode layer 172C. In these processes, a portion of the preliminary seed layer 176CL, which is arranged between each of the first supporter 192 and the second supporter 194 and the base electrode layer 172C, may remain without being removed.

According to some embodiments, portions of the bottom electrode 170C, which are surrounded by the first and second supporters 192 and 194, may include the second seed layer 176C2, and portions of the bottom electrode 170C, which are surrounded by the dielectric layer 180, may correspond to the sidewall and a top surface of the base electrode layer 172C. Thus, the dielectric layer 180 may include hafnium oxide having a tetragonal crystal phase. The hafnium oxide having a tetragonal crystal phase may have a dielectric constant that is greater than that of hafnium oxide having a monoclinic crystal phase, and thus, a capacitor structure CS1C may have relatively large capacitance.

In addition, according to example embodiments, the base electrode layer 172C may be formed in the opening 210H by a bottom-up filling method using the preliminary seed layer 176CL as a seed layer, and the generation of voids or seams inside the base electrode layer 172C may be prevented or reduced due to the bottom-up filling method.

Figure 10:
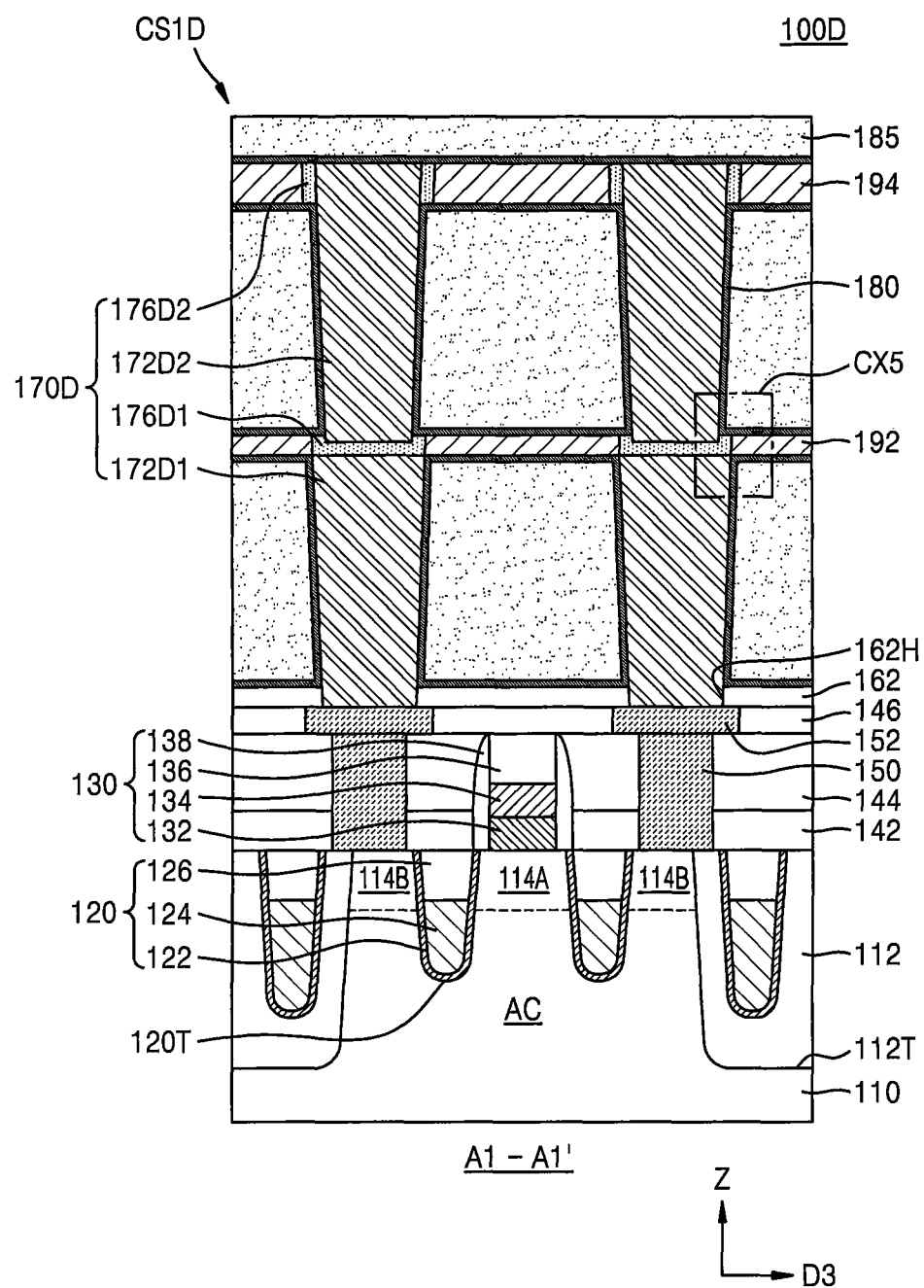
FIG. 10 is a cross-sectional view illustrating an integrated circuit device according to some embodiments.
Figure 11:
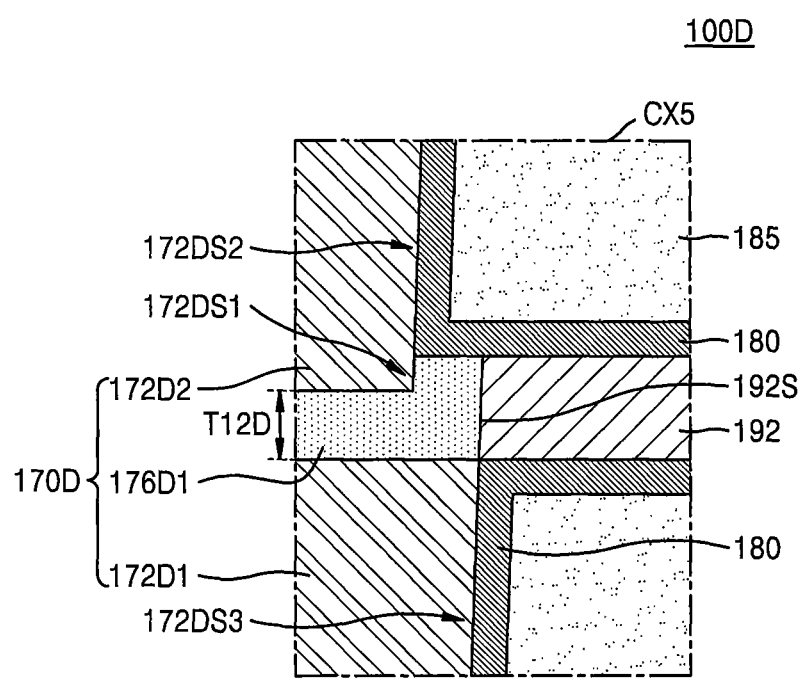
FIG. 11 is an enlarged view of an area CX5 of FIG. 10.

FIG. 10 is a cross-sectional view illustrating an integrated circuit device 100D according to example embodiments. FIG. 11 is an enlarged view of an area CX5 of FIG. 10. In FIGS. 10 and 11, the same reference numerals as in FIGS. 1 to 9 respectively denote the same components.

Referring to FIGS. 10 and 11, a bottom electrode 170D may include a first base electrode layer 172D1, a second base electrode layer 172D2, a first seed layer 176D1, and a second seed layer 176D2.

The first base electrode layer 172D1 may have a pillar shape extending in the vertical direction. A bottom portion of the first base electrode layer 172D1 may be arranged in the opening 162H of the etch stop layer 162, and a bottom surface of the first base electrode layer 172D1 may be arranged on the landing pad 152. A top surface of the first base electrode layer 172D1 may be at a level that is substantially equal to that of the bottom surface of the first supporter 192.

The first seed layer 176D1 may be arranged on the first base electrode layer 172D1 and surrounded by the first supporter 192. The first seed layer 176D1 may cover the entire top surface of the first base electrode layer 172D1 and may have a first thickness T12D of about 5 Å to about 200 Å in a direction that is perpendicular to the top surface of the substrate 110.

The second base electrode layer 172D2 may have a pillar shape extending in the vertical direction on the first seed layer 176D1. An upper sidewall of the second base electrode layer 172D2 may be surrounded by the second seed layer 176D2. The first seed layer 176D1 may be arranged between the second base electrode layer 172D2 and the first supporter 192, and the second seed layer 176D2 may be arranged between the second base electrode layer 172D2 and the second supporter 194.

As shown in FIG. 11, the second base electrode layer 172D2 may include a first sidewall 172DS1 and a second sidewall 172DS2, and the first base electrode layer 172D1 may include a third sidewall 172DS3. The first sidewall 172DS1 may be surrounded by the first seed layer 176D1 and may not contact the sidewall 192S of the first supporter 192. The second sidewall 172DS2 and the third sidewall 172DS3 may be surrounded by the dielectric layer 180 and may contact the dielectric layer 180. In some embodiments, the first sidewall 172DS1 and the second sidewall 172DS2 may be coplanar and aligned with each other. The third sidewall 172DS3 may be coplanar with the sidewall 192S of the first supporter 192. The first sidewall 172DS1 and the second sidewall 172DS2 may be recessed inwards (in a direction toward the center of the second base electrode layer 172D2) with respect to the third sidewall 172DS3. In addition, the first sidewall 172DS1 and the second sidewall 172DS2 may be recessed inwards (in a direction toward the center of the second base electrode layer 172D2) with respect to the sidewall 192S of the first supporter 192.

In some embodiments, each of the first and second base electrode layers 172D1 and 172D2 may include niobium nitride, and each of the first and second seed layers 176D1 and 176D2 may include titanium nitride. Portions of the bottom electrode 170D, which are surrounded by the dielectric layer 180, may correspond to a sidewall of the first base electrode layer 172D1 and a sidewall and a top surface of the second base electrode layer 172D2. Thus, the dielectric layer 180 may include hafnium oxide having a tetragonal crystal phase, and a capacitor structure CS1D may have relatively large capacitance.

In addition, according to some embodiments, the first and second base electrode layers 172D1 and 172D2 may be respectively formed in the opening 210H by a bottom-up filling method using the landing pad 152 and a preliminary seed layer 176DL (see FIG. 35) as seed layers, and the generation of voids or seams inside the first and second base electrode layers 172D1 and 172D2 may be prevented or reduced due to the bottom-up filling method.

FIGS. 12 to 19 are cross-sectional views illustrating sequential processes of a method of manufacturing the integrated circuit device 100 shown in FIGS. 1 to 3, according to some embodiments.

Figure 12:
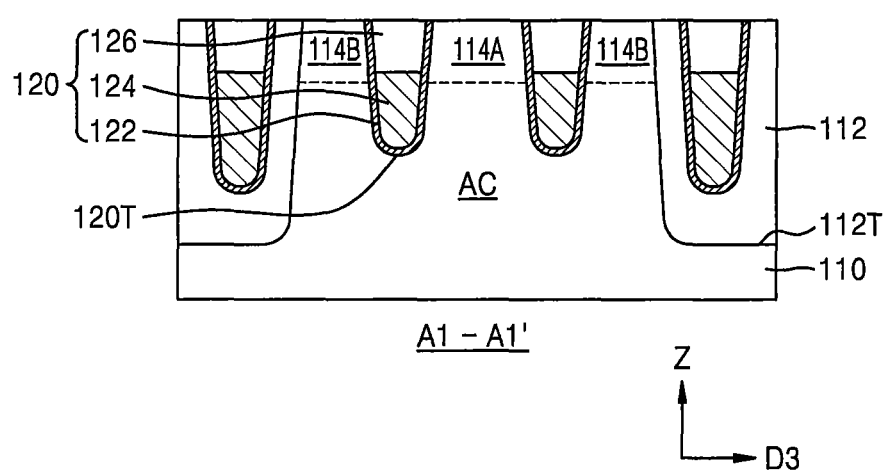
FIGS. 12 to 19 are cross-sectional views illustrating sequential processes of a method of manufacturing an integrated circuit device, according to some embodiments.

Referring to FIG. 12, the device isolation trench 112T may be formed in the substrate 110, and the device isolation film 112 may be formed in the device isolation trench 112T. The active region AC may be defined in the substrate 110 by the device isolation film 112.

Next, a first mask (not shown) may be formed on the substrate 110, and the gate line trench 120T may be formed in the substrate 110 by using the first mask as an etch mask. Gate line trenches 120T may have line shapes extending parallel to each other and crossing the active regions AC.

Next, the gate insulating layer 122 may be formed on the inner wall of the gate line trench 120T. A gate conductive layer (not shown) may be formed on the gate insulating layer 122 to fill the gate line trench 120T, followed by removing an upper portion of the gate conductive layer to a certain height by an etch-back process, thereby forming the gate electrode 124.

Next, an insulating material may be formed to fill the remaining portion of the gate line trench 120T, followed by planarizing the insulating material such that the top surface of the substrate 110 is exposed, thereby forming the gate capping layer 126 on the inner wall of the gate line trench 120T. Next, the first mask may be removed.

Next, the first and second source/drain regions 114A and 114B may be formed by implanting impurity ions into the substrate 110 at both sides of the gate structure 120. Alternatively, after the device isolation film 112 is formed, and prior to the formation of the gate line trench 120T and the gate line 120, the first and second source/drain regions 114A and 114B may be respectively formed in upper portions of the active region AC by implanting impurity ions into the substrate 110.

Figure 13:
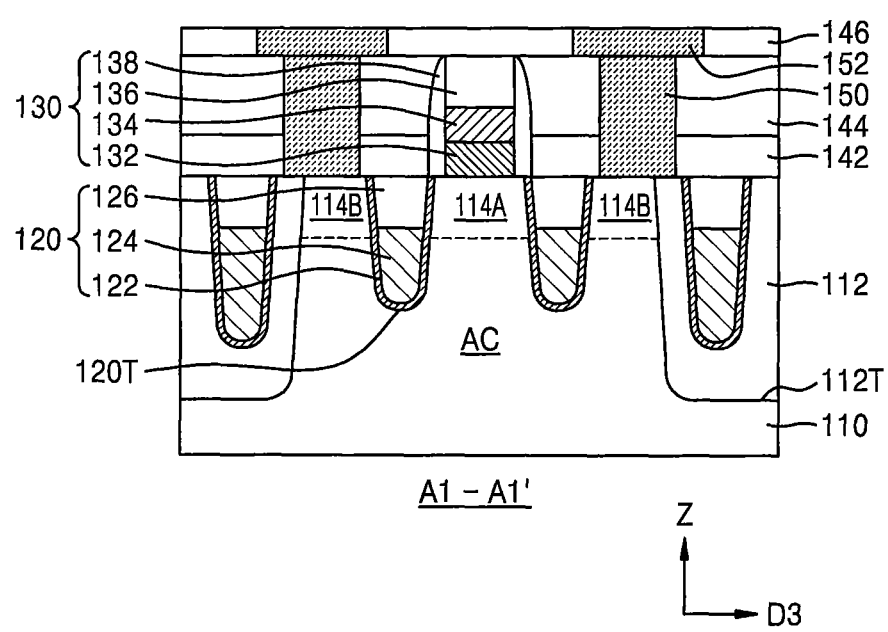

Referring to FIG. 13, the bit line structure 130, and the first insulating layer 142 and the second insulating layer 144, which surround the bit line structure 130, may be formed on the substrate 110. For example, the first insulating layer 142 may be formed first, and an opening (not shown) may be formed in the first insulating layer 142 to expose a top surface of the first source/drain region 114A. The bit line contact 132 may be formed on the first insulating layer 142 to fill the opening of the first insulating layer 142.

Next, a conductive layer (not shown) and an insulating layer (not shown) may be sequentially formed on the first insulating layer 142 in this stated order, and the bit line capping layer 136 and the bit line 134 may be formed by patterning the insulating layer and the conductive layer. The bit line capping layer 136 and the bit line 134 may extend in the Y direction (see FIG. 1) that is parallel to the top surface of the substrate 110. Next, the bit line spacer 138 may be formed on sidewalls of the bit line contact 132, the bit line 134, and the bit line capping layer 136.

The second insulating layer 144 may be formed on the first insulating layer 142 to cover at least sidewalls of the bit line structure 130.

Next, an opening (not shown) may be formed in the first insulating layer 142 and the second insulating layer 144 to expose a top surface of the second source/drain region 114B, and the capacitor contact 150 may be formed in the opening of the first and second insulating layers 142 and 144. In some embodiments, the capacitor contact 150 may be formed by sequentially forming a lower contact pattern (not shown), a metal silicide layer (not shown), a barrier layer (not shown), and an upper contact pattern (not shown) in the opening of the first and second insulating layers 142 and 144 in this stated order.

Next, the third insulating layer 146 may be formed on the capacitor contact 150 and the second insulating layer 144, an opening (not shown) may be formed in the third insulating layer 146 to expose a top surface of the capacitor contact 150, and the landing pad 152 may be formed in the opening of the third insulating layer 146.

Figure 14:
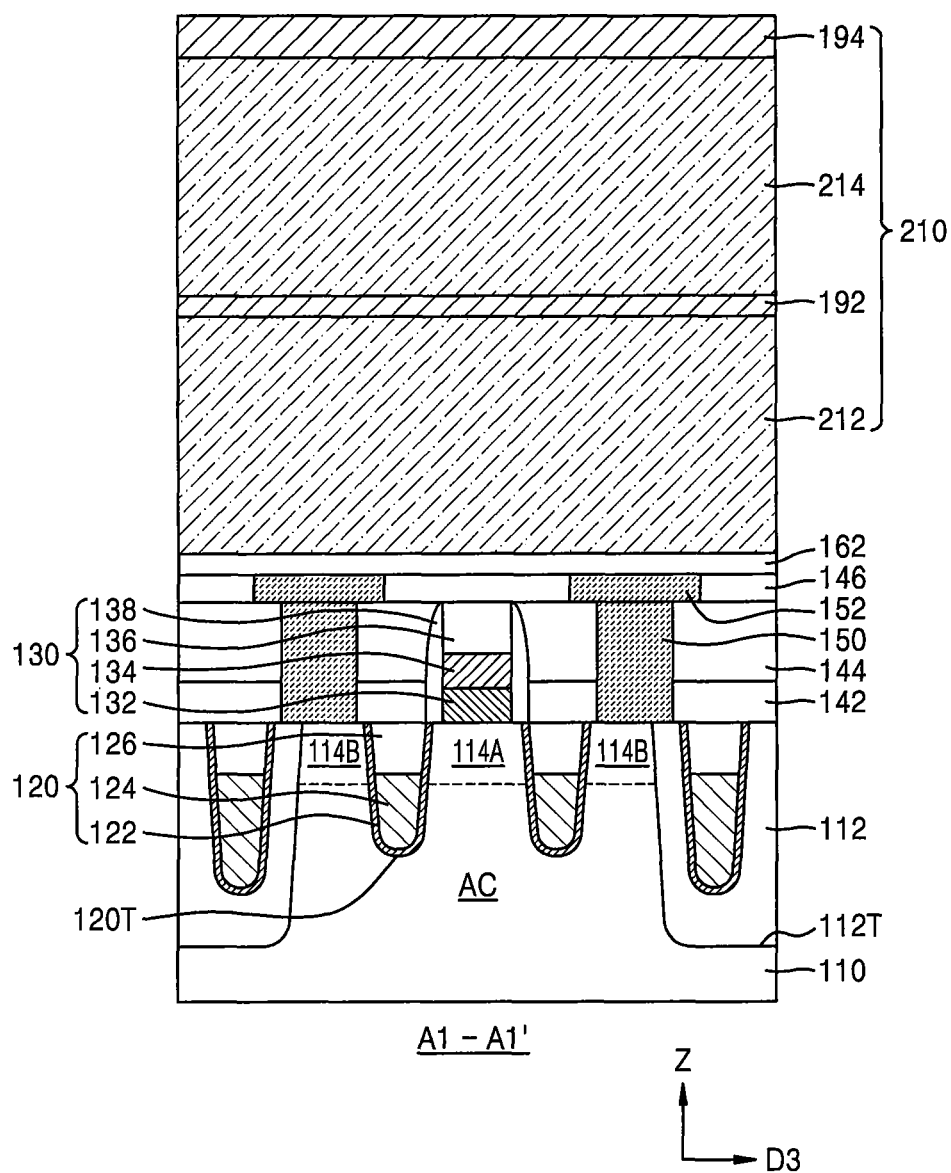

Referring to FIG. 14, the etch stop layer 162 and the mold structure 210 may be sequentially formed on the landing pad 152 and the third insulating layer 146 in this stated order. The mold structure 210 may include a first mold layer 212, the first supporter 192, a second mold layer 214, and the second supporter 194, which are sequentially formed on the etch stop layer 162 in this stated order. In some embodiments, a plurality of first mold layers 212 and a plurality of first supporters 192 may be alternately arranged. In some embodiments, an etch stop layer (not shown) may be further formed between the second supporter 194 and the second mold layer 214 or on the second supporter 194.

In some embodiments, the first mold layer 212 and the etch stop layer 162 may respectively include materials having etch selectivities with respect to each other. For example, when the first mold layer 212 includes silicon oxide, the etch stop layer 162 may include silicon nitride, silicon oxynitride, or silicon carbon nitride (SiCN). In addition, each of the first and second mold layers 212 and 214 may include a material having etch selectivity with respect to each of the first and second supporters 192 and 194, and vice versa. For example, when each of the first and second mold layers 212 and 214 includes silicon oxide, each of the first and second supporters 192 and 194 may include silicon nitride, silicon oxynitride, silicon boron nitride (SiBN), or silicon carbon nitride (SiCN).

Figure 15:
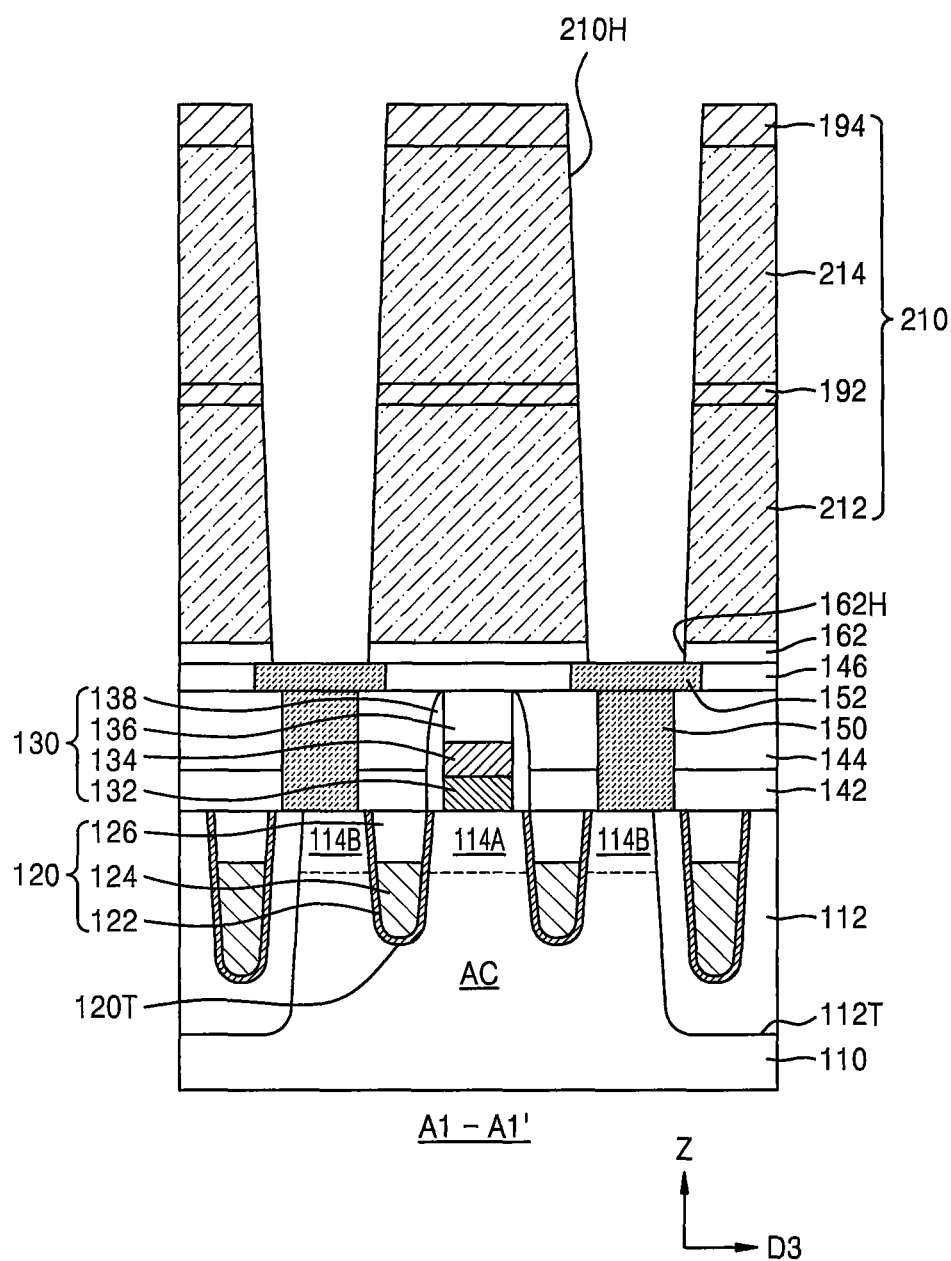

Referring to FIG. 15, a mask layer (not shown) may be formed on the second supporter 194, and the opening 210H may be formed in the mold structure 210 by using the mask layer. Here, the etch stop layer 162 may be partially removed, and the opening 162H may be formed in the etch stop layer 162 to communicate with the opening 210H. The top surface of the landing pad 152 may be exposed by the opening 210H and the opening 162H.

Figure 16:
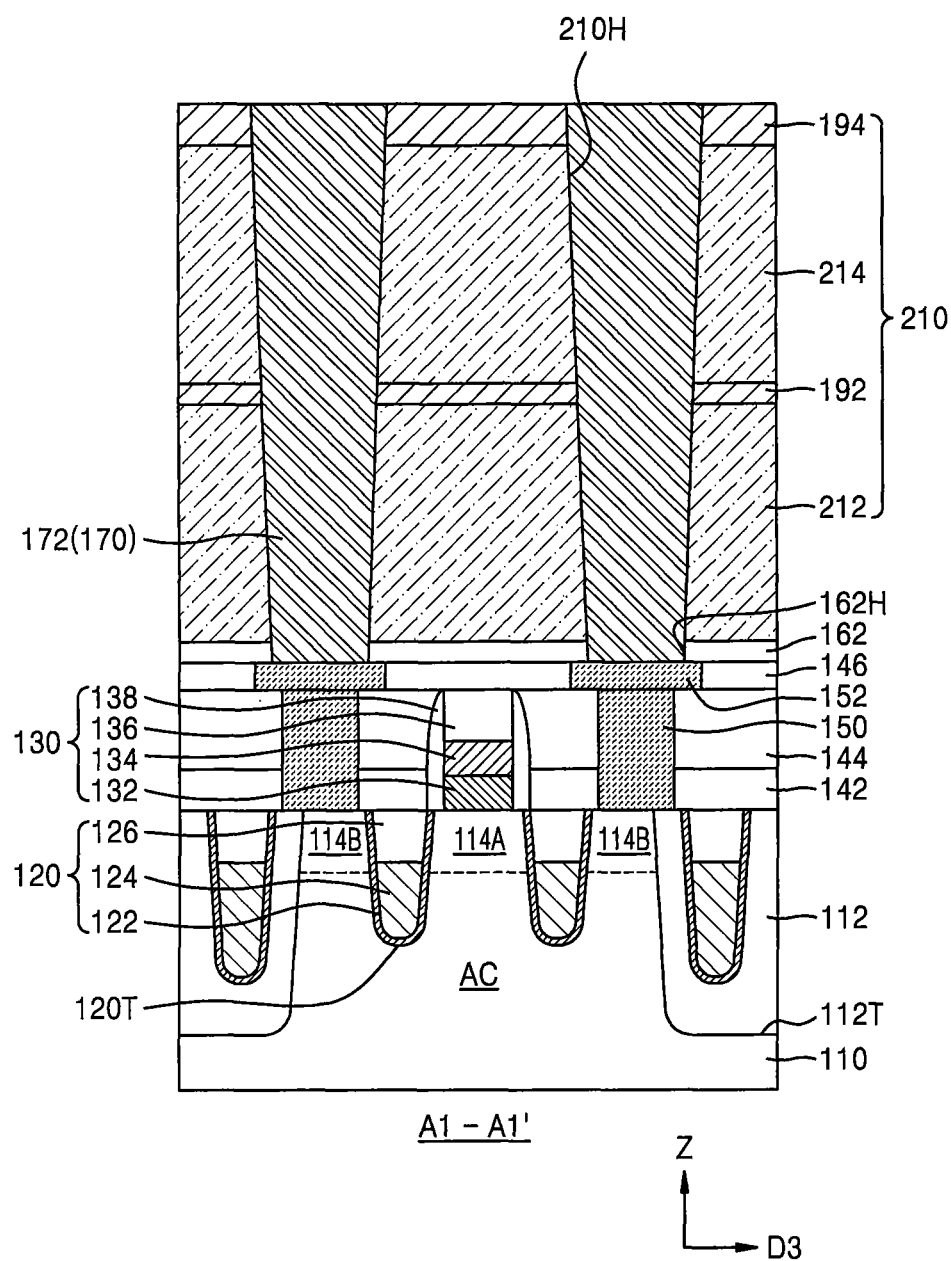

Referring to FIG. 16, the base electrode layer 172 may be formed on the landing pad 152 and the mold structure 210 to fill the openings 162H and 210H.

For example, the process of forming the base electrode layer 172 may include a chemical vapor deposition (CVD) process, a metal organic CVD (MOCVD) process, an atomic layer deposition (ALD) process, or a metal organic ALD (MOALD) process.

For example, the process of forming the base electrode layer 172 may include an ALD process performed in a bottom-up filling manner by using the exposed top surface of the landing pad 152 as a seed layer and using a niobium halide such as niobium pentafluoride ($NbF_5$) or niobium pentachloride ($NbCl_5$) as a precursor source. In other embodiments, the process of forming the base electrode layer 172 may include an ALD process performed in a bottom-up filling manner by using the exposed top surface of the landing pad 152 as a seed layer and using, as a precursor source, a metal organic precursor including niobium. For example, the metal organic precursor may include tris(diethylamido)(tert-butylimido)niobium (TBTDEN), (tert-butylimido)bis(dimethylamino)niobium (TBTDMN), (tert-butylimido)bis(ethylmethylamino)niobium (TBTEMN), or bis(cyclopentadienyl)niobium(IV) dichloride, although the present disclosure is not limited thereto.

In some embodiments, a process of depositing the base electrode layer 172 may be performed by repeating a cycle of forming a material layer a plurality of times, and the cycle of forming the material layer may include feeding a first precursor source including niobium, purging an excess of the first precursor source, feeding a second precursor source including nitrogen, and purging an excess of the second precursor source.

In some embodiments, when a niobium halide is used as the first precursor source, the material layer may be grown as a continuous layer on a surface of the landing pad 152, whereas the material layer may be grown in island shapes or dot shapes on the first and second mold layers 212 and 214 and the first and second supporters 192 and 194. Thus, a formation rate of the material layer on the surface of the landing pad 152, which is exposed at the bottom of the opening 210H, may be significantly higher than the formation rate of the material layer on surfaces of the first and second mold layers 212 and 214 and the first and second supporters 192 and 194, which are exposed at the sidewall of the opening 210H, and the base electrode layer 172 may be formed at a relatively high rate in the vertical direction from the bottom of the opening 210H. The base electrode layer 172 may fill the opening 210H in a bottom-up filling manner due to selective deposition properties thereof on the bottom of the opening 210H, and thus, the generation of voids or seams inside the base electrode layer 172 may be prevented or reduced even though an aspect ratio of the opening 210H is high.

Figure 17:
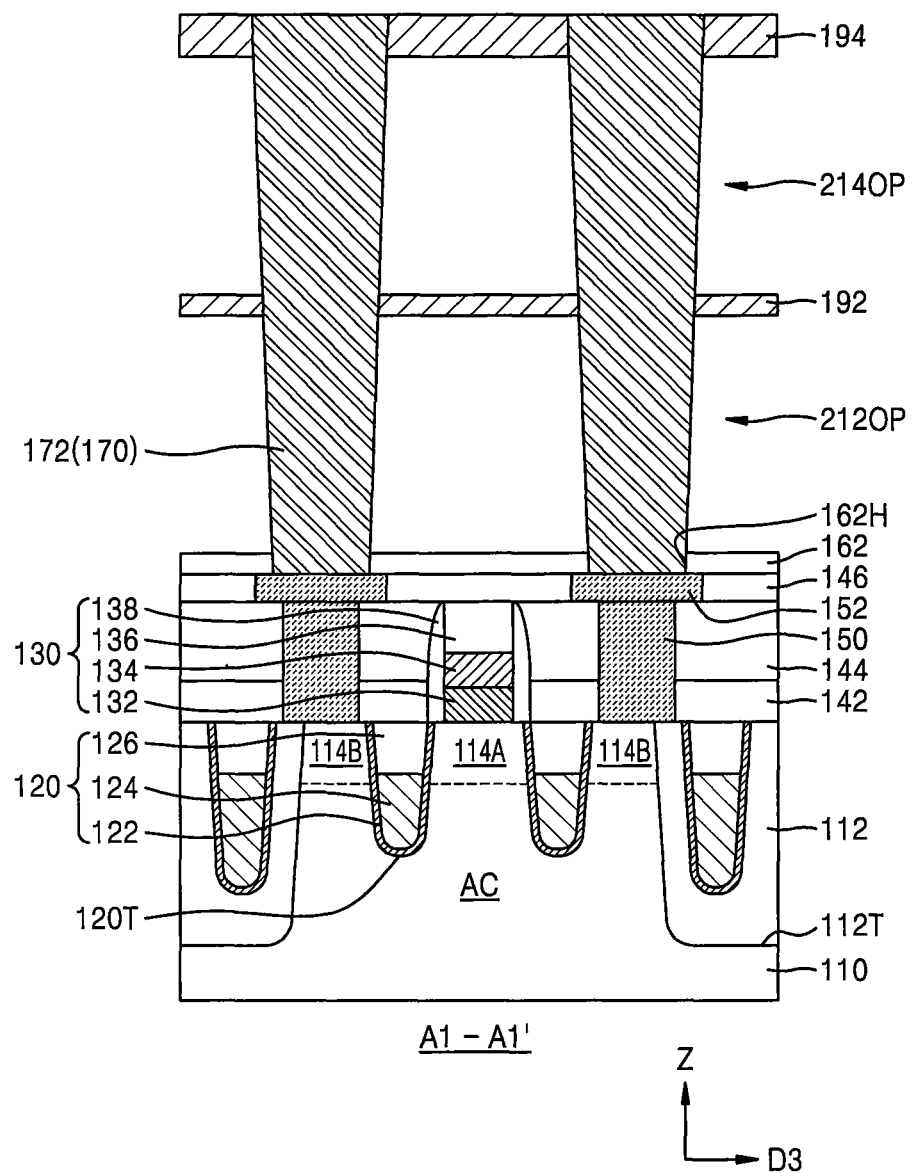

Referring to FIG. 17, the first mold opening 212OP and the second mold opening 214OP may be respectively formed by removing the first mold layer 212 and the second mold layer 214. In the process of removing the first mold layer 212 and the second mold layer 214, the first supporter 192 and the second supporter 194 may not be removed, and the base electrode layer 172 may be connected to and supported by the first supporter 192 and the second supporter 194.

Figure 18:
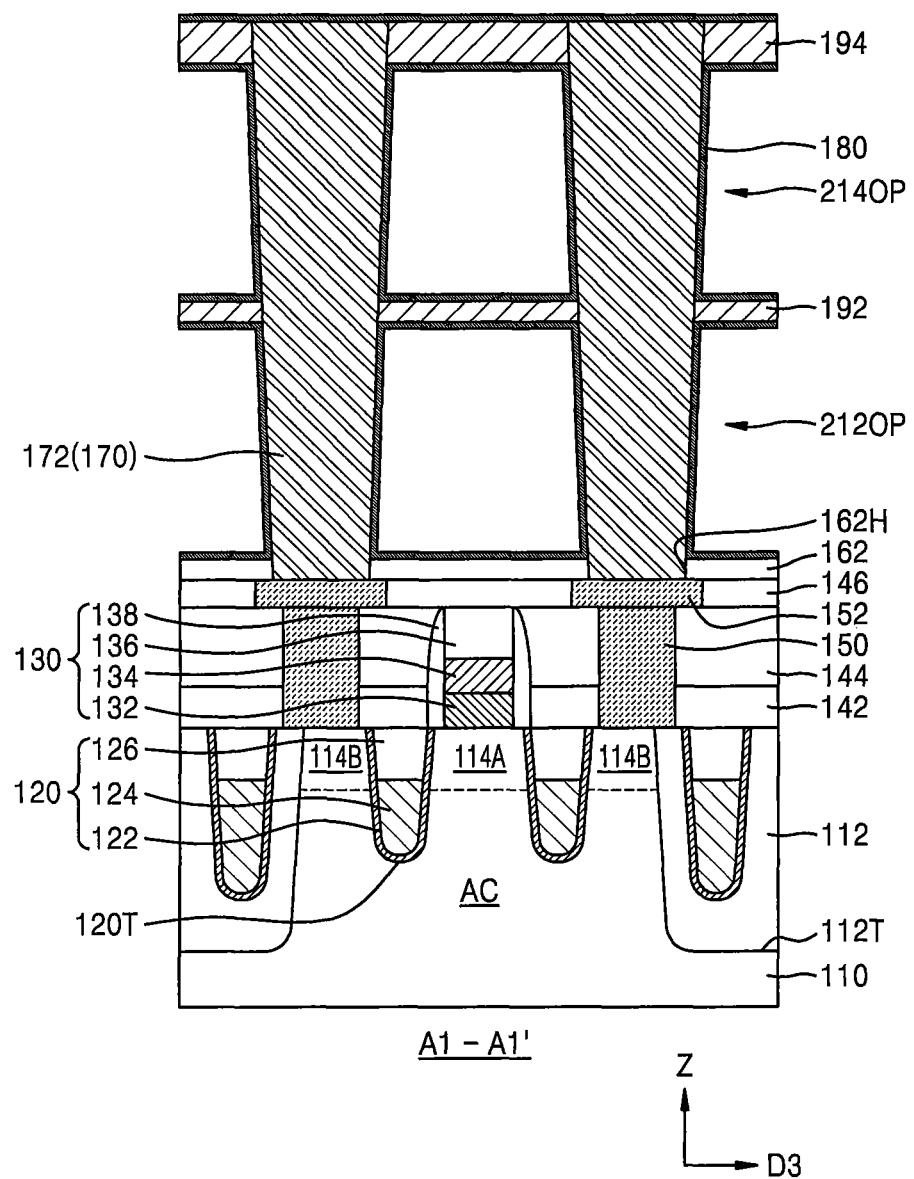

Referring to FIG. 18, the dielectric layer 180 may be conformally formed on exposed surfaces of the base electrode layer 172, the first supporter 192, and the second supporter 194.

In example embodiments, the dielectric layer 180 may be formed by a CVD process, an MOCVD process, an ALD process, an MOALD process, or the like. In example embodiments, the dielectric layer 180 may be formed by using hafnium oxide, and a portion of the dielectric layer 180, which contacts the base electrode layer 172, may predominantly have a tetragonal crystal phase.

Figure 19:
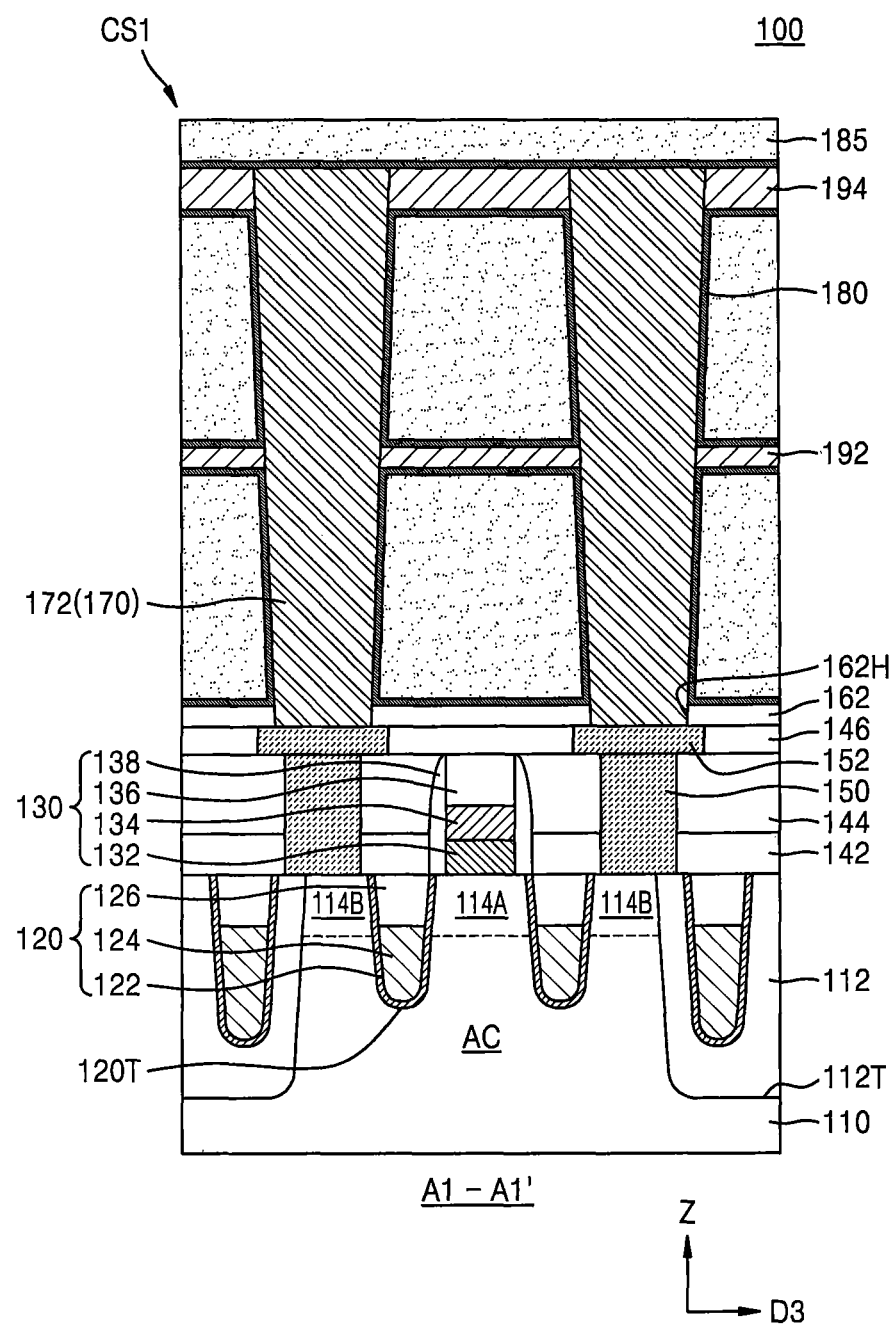

Referring to FIG. 19, the top electrode 185 may be formed on the dielectric layer 180.

Optionally, after the top electrode 185 is formed, an annealing process may be further performed.

According to the foregoing method of manufacturing the integrated circuit device 100, according to some embodiments, the base electrode layer 172 may fill the opening 210H in a bottom-up filling manner due to the selective deposition properties thereof on the bottom of the opening 210H, and thus, the generation of voids or seams inside the base electrode layer 172 may be prevented or reduced even though the aspect ratio of the opening 210H is high.

FIGS. 20 to 23 are cross-sectional views illustrating sequential processes of a method of manufacturing the integrated circuit device 100A shown in FIGS. 4 and 5, according to example embodiments.

First, the mold structure 210 including the opening 210H may be formed by performing the processes described with reference to FIGS. 12 to 15.

Figure 20:
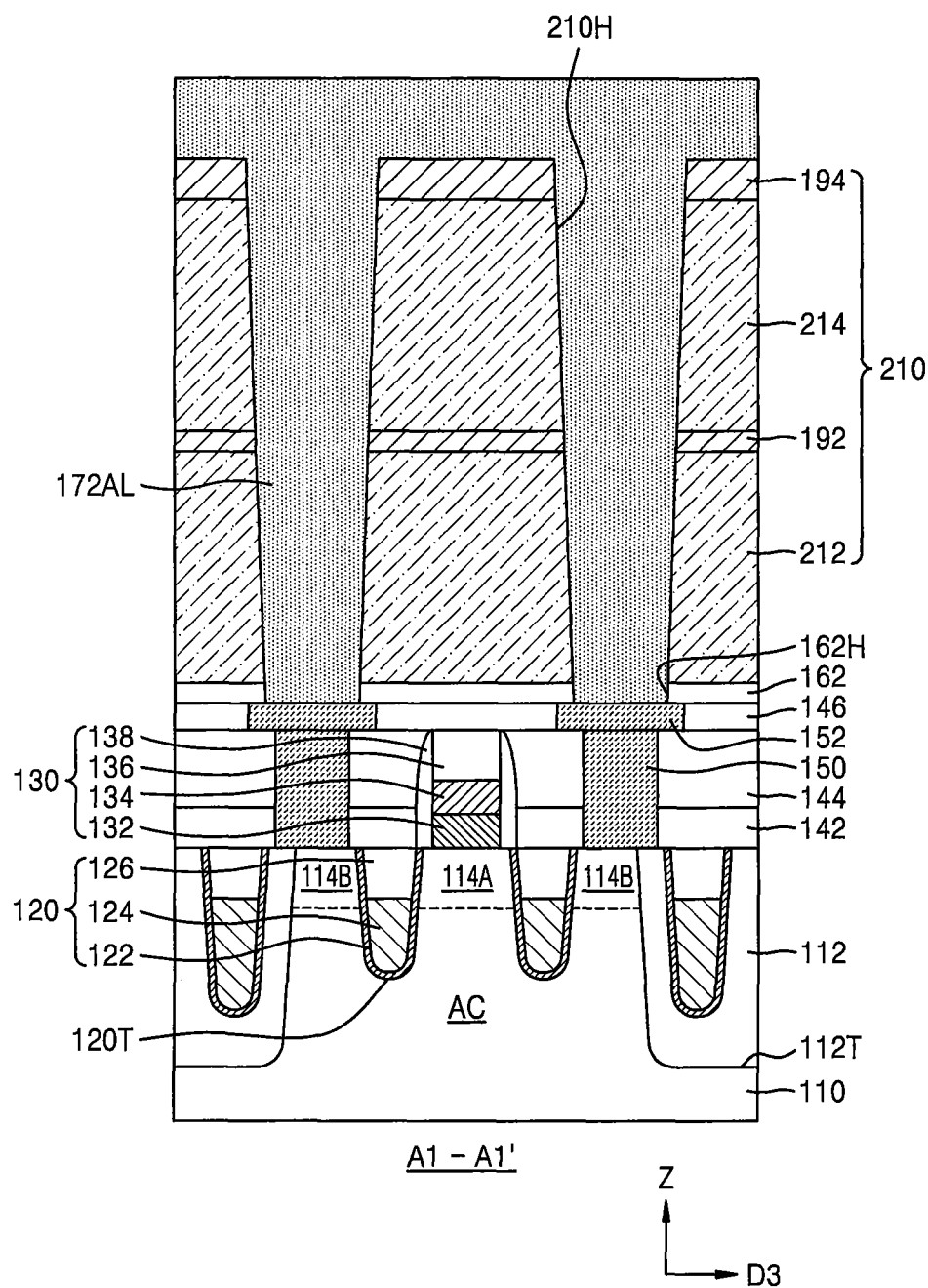
FIGS. 20 to 23 are cross-sectional views illustrating sequential processes of a method of manufacturing an integrated circuit device, according to some embodiments.

Referring to FIG. 20, a preliminary base electrode layer 172AL may be formed on the mold structure 210. In some examples, the preliminary base electrode layer 172AL may be formed by using titanium nitride. The preliminary base electrode layer 172AL may be formed on an inner wall of the opening 210H and on a top surface of the mold structure 210.

Figure 21:
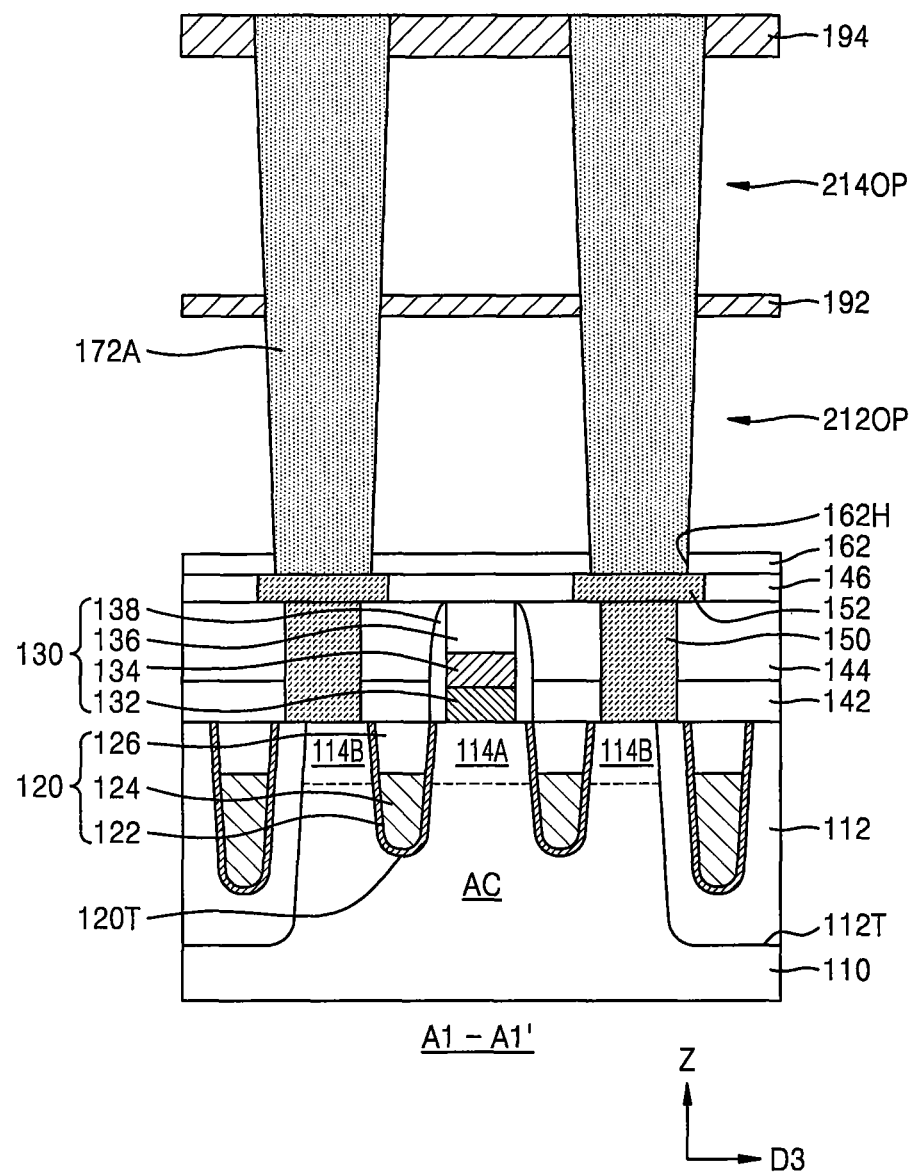

Referring to FIG. 21, an upper portion of the preliminary base electrode layer 172AL (see FIG. 20) may be removed such that the top surface of the second supporter 194 is exposed, thereby forming the base electrode layer 172A.

Next, the first mold opening 212OP and the second mold opening 214OP may be formed by removing the first mold layer 212 and the second mold layer 214. In the process of removing the first mold layer 212 and the second mold layer 214, the first supporter 192 and the second supporter 194 may not be removed, and the base electrode layer 172A may be connected to and supported by the first supporter 192 and the second supporter 194.

Figure 22:
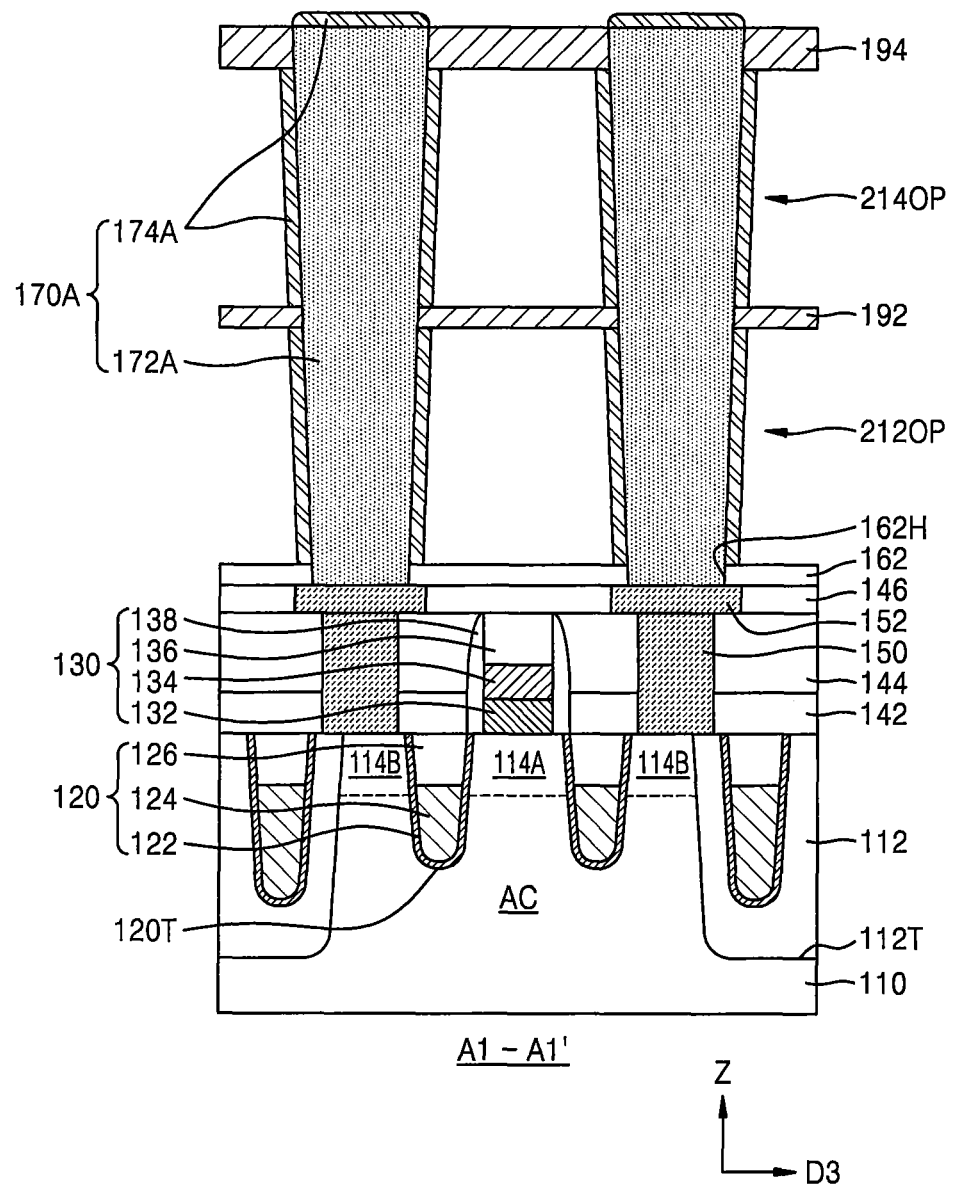

Referring to FIG. 22, the conductive capping layer 174A may be formed on the exposed sidewall and the top surface of the base electrode layer 172A.

For example, the process of forming the conductive capping layer 174A may include an ALD process performed in a bottom-up filling manner by using an exposed surface of the base electrode layer 172A as a seed layer and using, as a precursor source, a niobium halide such as niobium pentafluoride ($NbF_5$) or niobium pentachloride ($NbCl_5$) or a metal organic precursor including niobium.

In some embodiments, when a niobium halide is used as the precursor source, the conductive capping layer 174A may be grown as a continuous layer on the surface of the base electrode layer 172A, whereas the conductive capping layer 174A may be grown in island shapes or dot shapes on the etch stop layer 162 and the first and second supporters 192 and 194. Thus, while the conductive capping layer 174A is formed as a continuous layer having a first thickness T11A (see FIG. 5) on the sidewall and the top surface of the base electrode layer 172A, the conductive capping layer 174A may be scarcely or minimally formed on the etch stop layer 162 and the first and second supporters 192 and 194, or may be removed in a purge process or a selective cleaning process even though slightly formed.

Therefore, the conductive capping layer 174A may be selectively deposited on the base electrode layer 172A.

Figure 23:
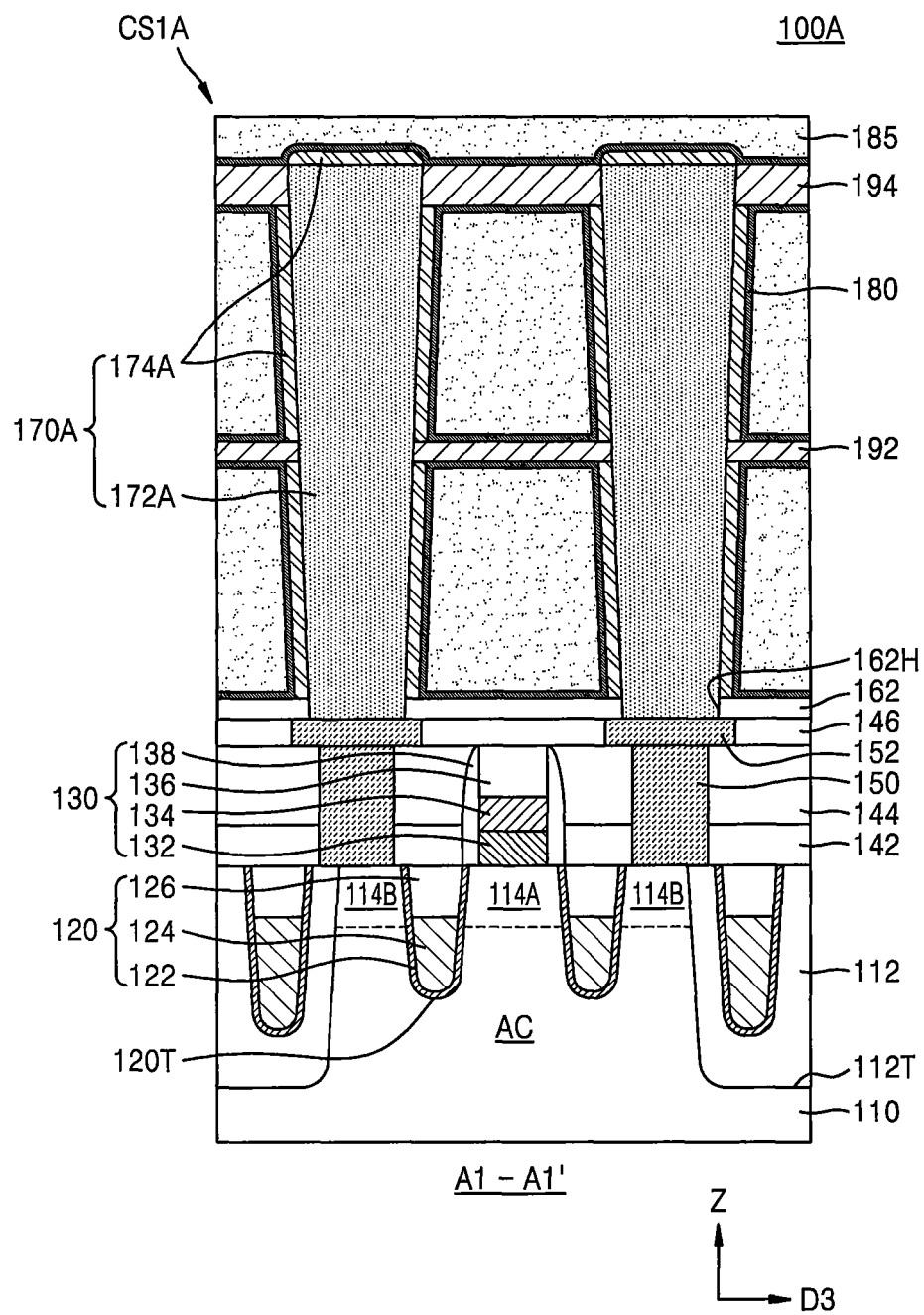

Referring to FIG. 23, the dielectric layer 180 may be formed on the exposed surfaces of the conductive capping layer 174A, the first supporter 192, and the second supporter 194, and the top electrode 185 may be formed to cover the dielectric layer 180. The dielectric layer 180 may be formed by using hafnium oxide, and a portion of the dielectric layer 180, which contacts the conductive capping layer 174A, may predominantly have a tetragonal crystal phase.

According to the foregoing method of manufacturing the integrated circuit device 100A, according to some embodiments, the conductive capping layer 174A may be formed on the exposed surface of the base electrode layer 172A by a selective deposition method, and the dielectric layer 180 may be formed on the conductive capping layer 174A such that the dielectric layer 180 has a tetragonal crystal phase having a relatively high dielectric constant.

Figure 24:
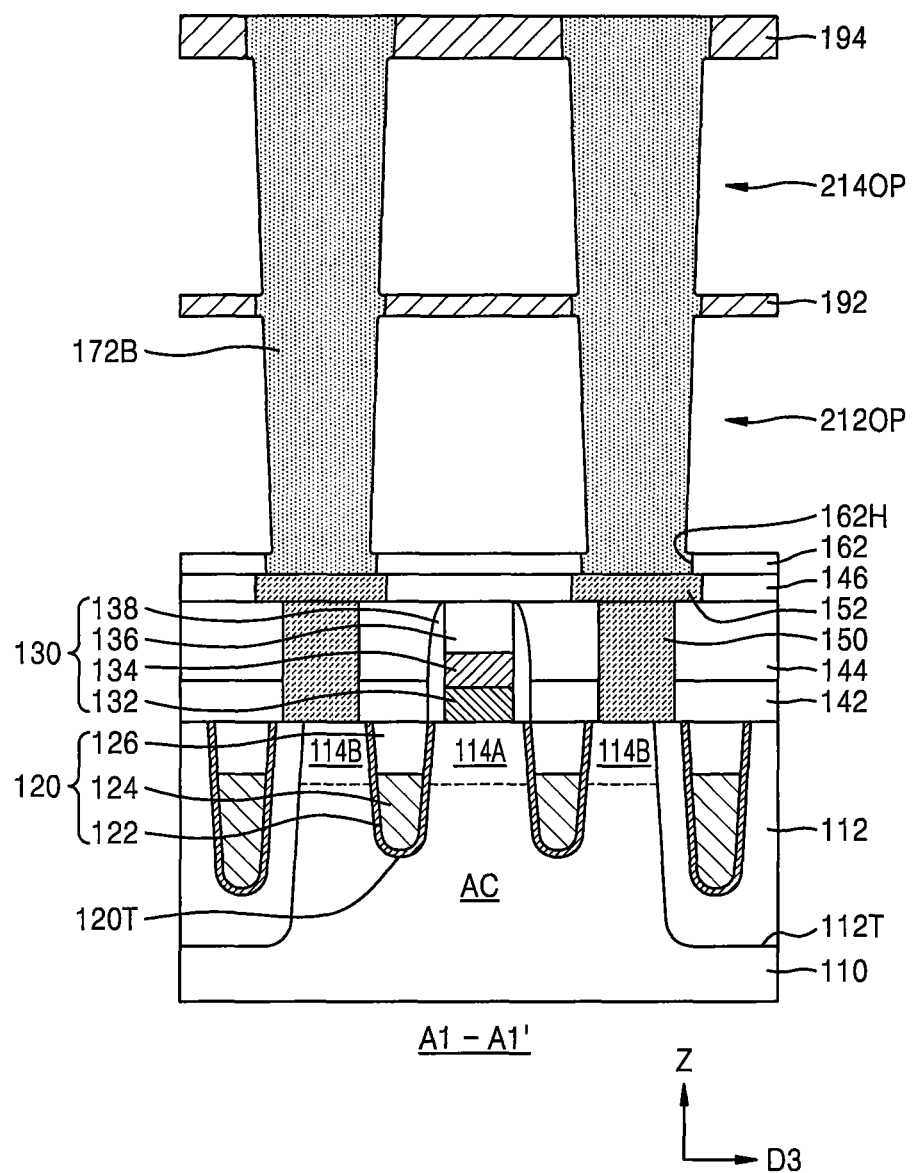
FIGS. 24 to 26 are cross-sectional views illustrating sequential processes of a method of manufacturing an integrated circuit device, according to some embodiments.
Figure 25:
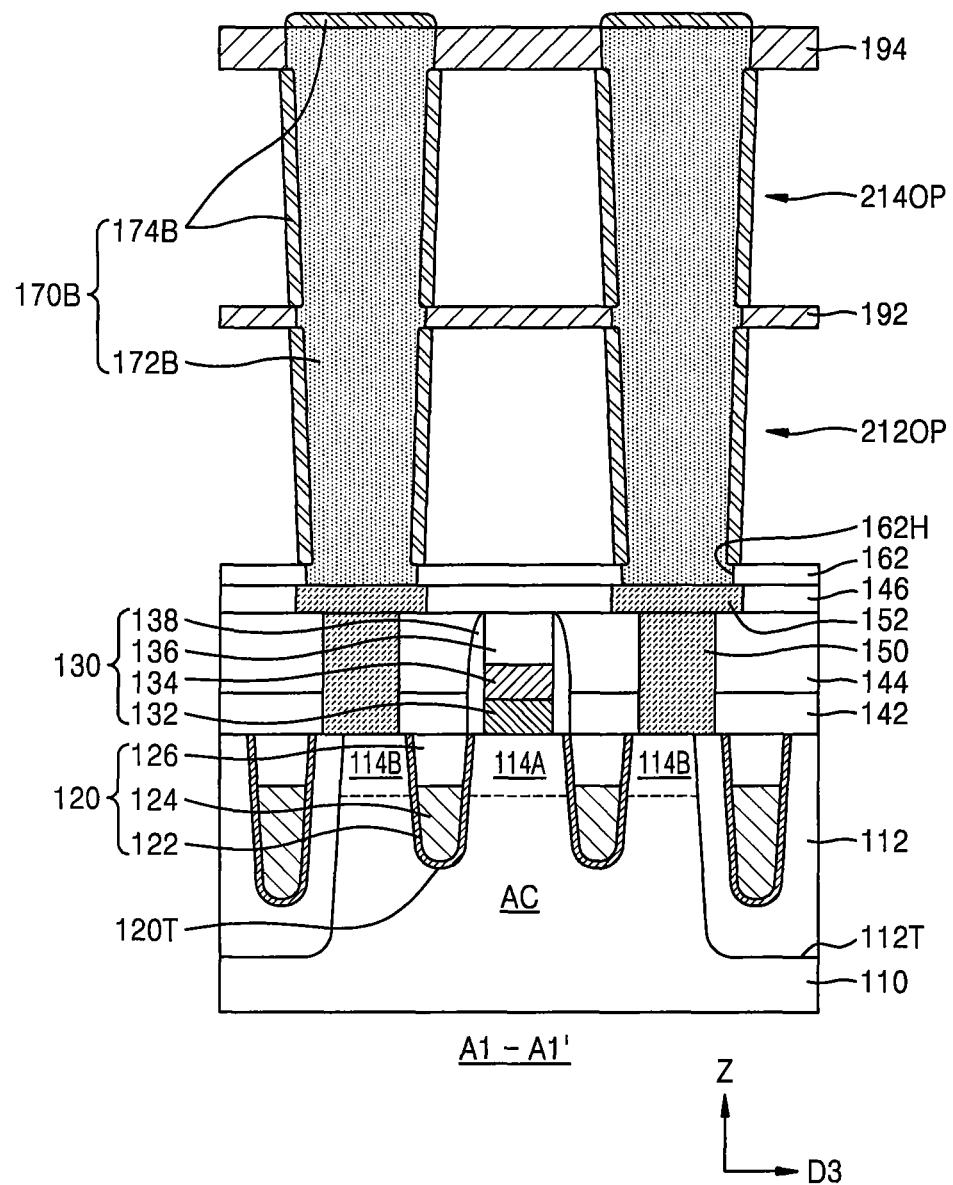
Figure 26:
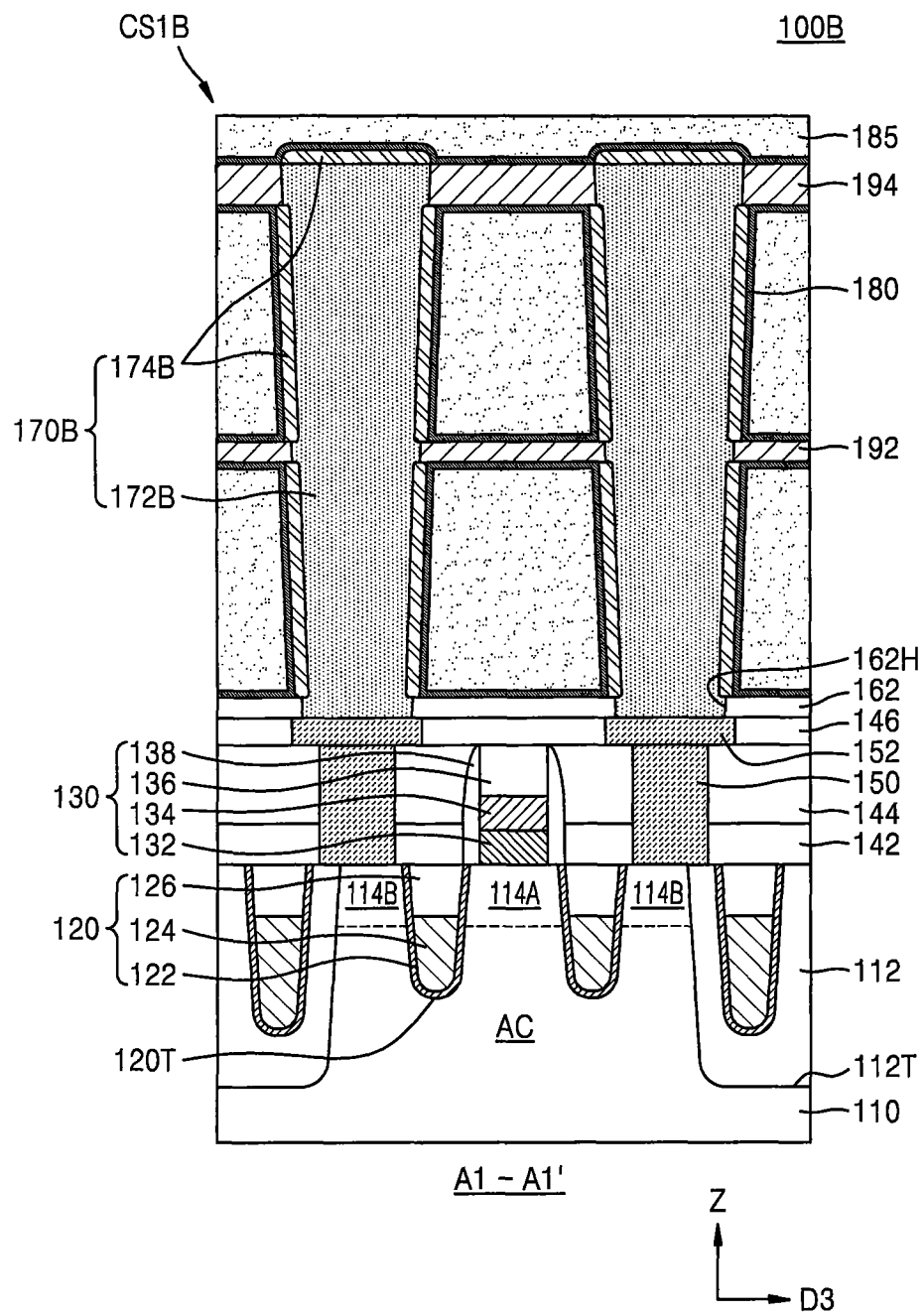

FIGS. 24 to 26 are cross-sectional views illustrating sequential processes of a method of manufacturing the integrated circuit device 100B shown in FIGS. 6 and 7, according to some embodiments.

First, the base electrode layer 172B is formed on the inner wall of the opening 210H of the mold structure 210 by performing the processes described with reference to FIG. 20.

Referring to FIG. 24, the first mold layer 212 (see FIG. 20) and the second mold layer 214 (see FIG. 20) may be removed, and the first mold opening 212OP and the second mold opening 214OP may be formed in spaces from which the first mold layer 212 and the second mold layer 214 are removed.

Next, the sidewall of the base electrode layer 172B, which is exposed by the first mold opening 212OP and the second mold opening 214OP, may be further removed by a certain thickness. In some embodiments, the process of removing the sidewall of the base electrode layer 172B may be performed in the same process as the process of removing the first mold layer 212 and the second mold layer 214, or may be separately performed after the process of removing the first mold layer 212 and the second mold layer 214.

Referring to FIG. 25, the conductive capping layer 174B may be formed on the sidewall and the top surface of the base electrode layer 172B. The process of forming the conductive capping layer 174B may be similar to the process of forming the conductive capping layer 174A, which has been described with reference to FIG. 22.

Referring to FIG. 26, the dielectric layer 180 may be formed on the conductive capping layer 174B, the first supporter 192, and the second supporter 194, and the top electrode 185 may be formed to cover the dielectric layer 180.

FIGS. 27 to 33 are cross-sectional views illustrating sequential processes of a method of manufacturing the integrated circuit device 100C shown in FIGS. 8 and 9, according to example embodiments.

Figure 27:
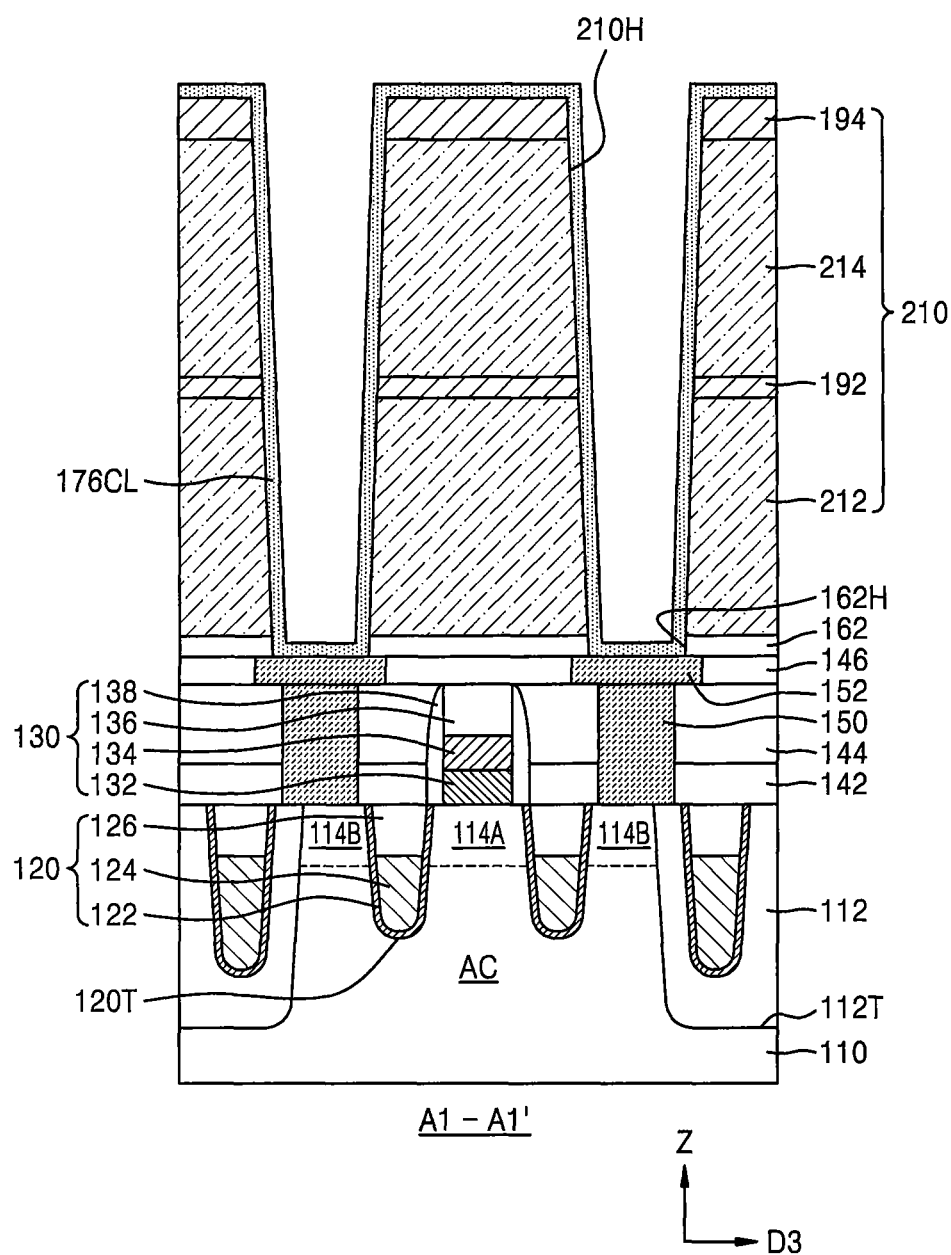
FIGS. 27 to 33 are cross-sectional views illustrating sequential processes of a method of manufacturing an integrated circuit device, according to some embodiments.

Referring to FIG. 27, the preliminary seed layer 176CL may be formed on the inner wall of the opening 210H of the mold structure 210 and the top surface of the mold structure 210. For example, the preliminary seed layer 176CL may be formed by a CVD process, an MOCVD process, an ALD process, an MOALD process, or the like by using titanium nitride, tungsten, or the like. The preliminary seed layer 176CL may have a second thickness T12C (see FIG. 9) of about 5 Å to about 200 Å.

Figure 28:
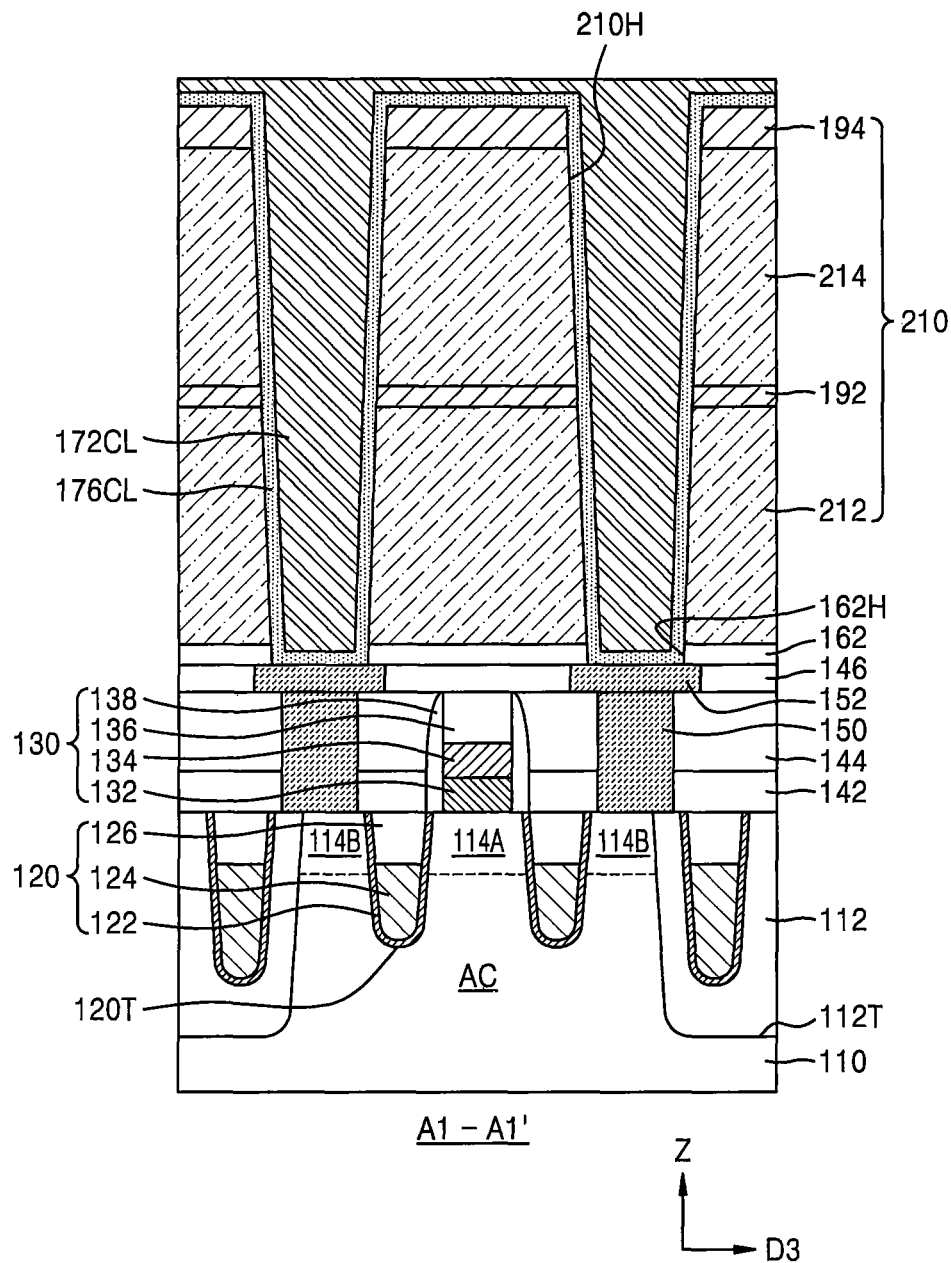

Referring to FIG. 28, the preliminary base electrode layer 172CL may be formed on the preliminary seed layer 176CL to fill an internal space of the opening 210H. The process of forming the preliminary base electrode layer 172CL may include an ALD process performed in a bottom-up filling manner by using an exposed top surface of the preliminary seed layer 176CL as a seed layer and using a niobium halide such as niobium pentafluoride ($NbF_5$) or niobium pentachloride ($NbCl_5$) as a precursor source. In other embodiments, the process of forming the preliminary base electrode layer 172CL may include an ALD process performed in a bottom-up filling manner by using the exposed top surface of the preliminary seed layer 176CL as a seed layer and using, as a precursor source, a metal organic precursor including niobium. The process of forming the preliminary base electrode layer 172CL may be similar to the process of forming the base electrode layer 172, which has been described with reference to FIG. 16.

The preliminary base electrode layer 172CL may fill the opening 210H in a bottom-up filling manner due to selective deposition properties thereof on the bottom of the opening 210H, and thus, the generation of voids or seams inside the preliminary base electrode layer 172CL may be prevented or reduced even though the aspect ratio of the opening 210H is high.

Figure 29:
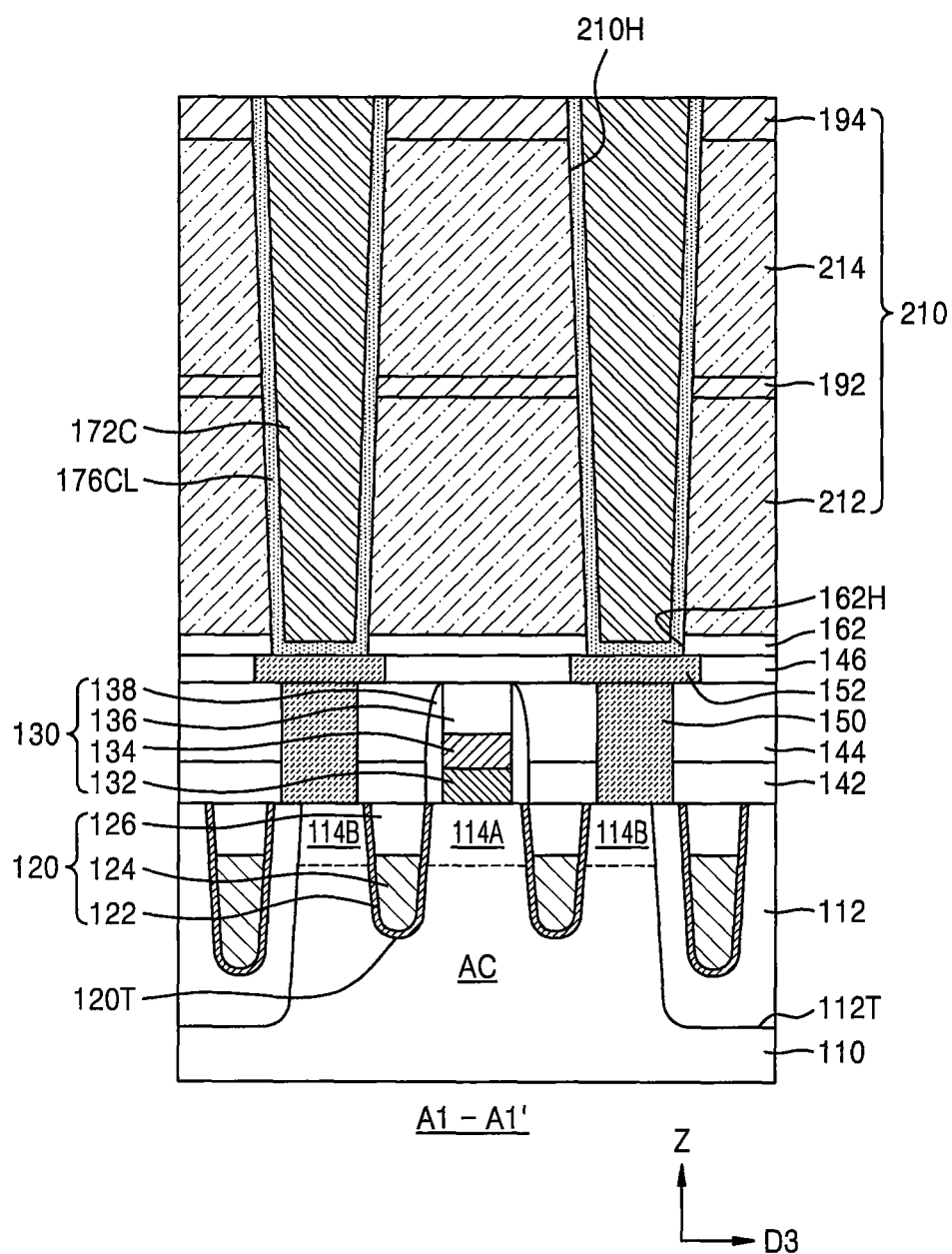

Referring to FIG. 29, upper portions of both the preliminary base electrode layer 172CL and the preliminary seed layer 176CL may be removed such that the top surface of the second supporter 194 is exposed. Here, the base electrode layer 172C in one opening 210H may be separated from the base electrode layer 172C in an adjacent opening 210H.

Figure 30:
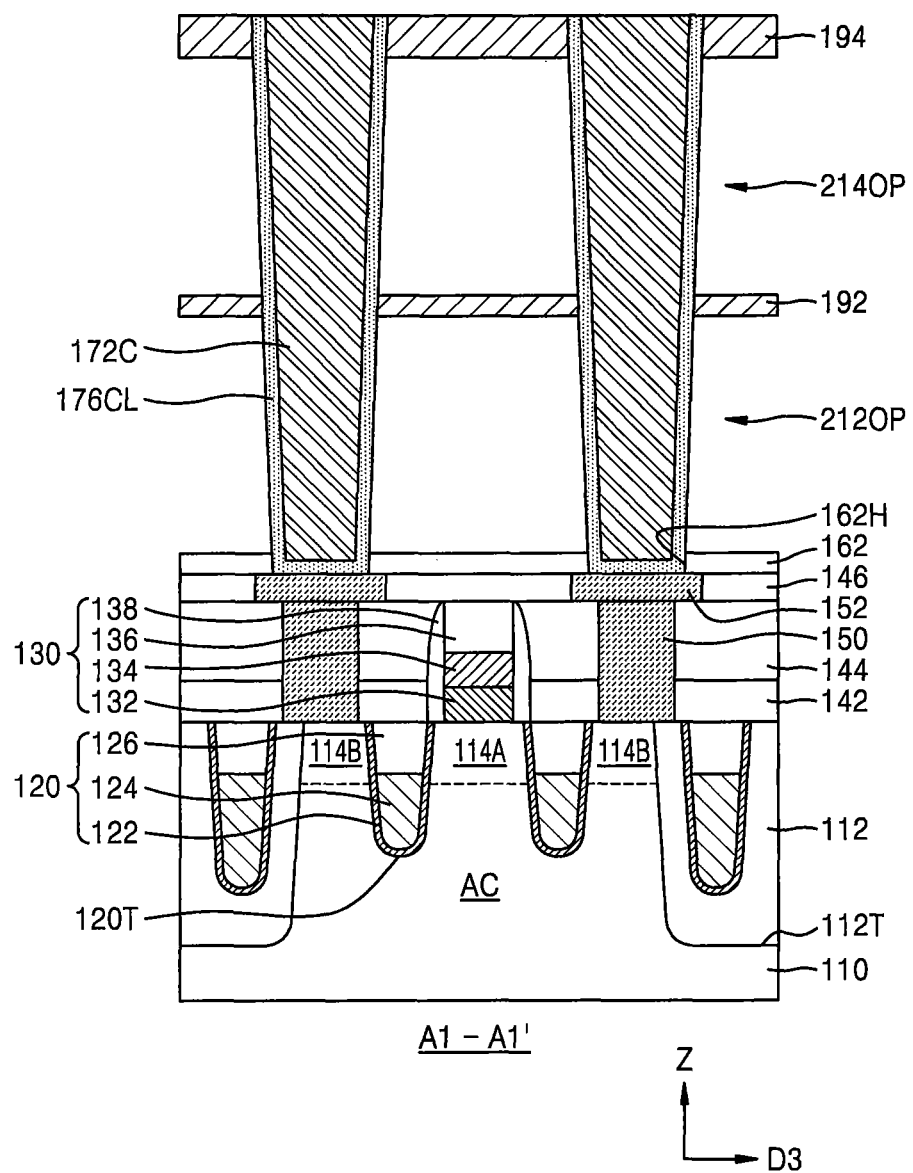

Referring to FIG. 30, the first mold opening 212OP and the second mold opening 214OP may be respectively formed by removing the first mold layer 212 and the second mold layer 214. In the process of removing the first mold layer 212 and the second mold layer 214, the first supporter 192 and the second supporter 194 may not be removed, and a sidewall of the preliminary seed layer 176CL may be exposed by the first mold opening 212OP and the second mold opening 214OP.

Figure 31:
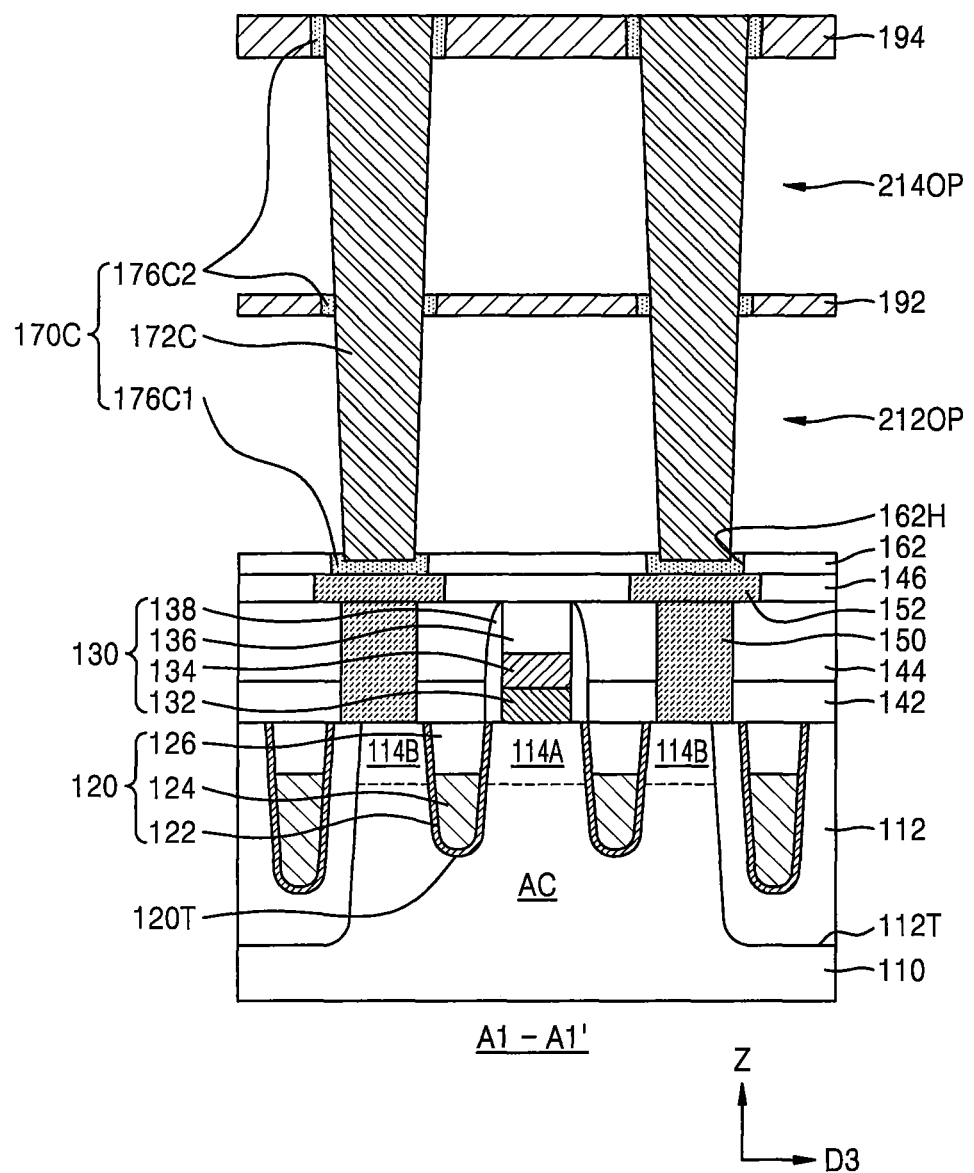

Referring to FIG. 31, a portion of the preliminary seed layer 176CL, which is exposed by the first mold opening 212OP and the second mold opening 214OP, may be removed.

In some embodiments, the process of removing the exposed portion of the preliminary seed layer 176CL may include a wet etching process. After the process of removing the exposed portion of the preliminary seed layer 176CL, the sidewall of the base electrode layer 172C may be exposed. In the process of removing the exposed portion of the preliminary seed layer 176CL, a portion of the preliminary seed layer 176CL, which is arranged in the opening 162H of the etch stop layer 162 and between the bottom of the base electrode layer 172C and the landing pad 152, may not be removed. The portion of the preliminary seed layer 176CL, which remains as such, may be referred to as the first seed layer 176C1. In addition, in the process of removing the exposed portion of the preliminary seed layer 176CL, a portion of the preliminary seed layer 176CL, which is arranged between the sidewall of the base electrode layer 172C and the first supporter 192, and a portion of the preliminary seed layer 176CL, which is arranged between the sidewall of the base electrode layer 172C and the second supporter 194, may not be removed. The portions of the preliminary seed layer 176CL, which remain between the sidewall of the base electrode layer 172C and the first supporter 192 and between the sidewall of the base electrode layer 172C and the second supporter 194, may be referred to as the second seed layer 176C2.

Figure 32:
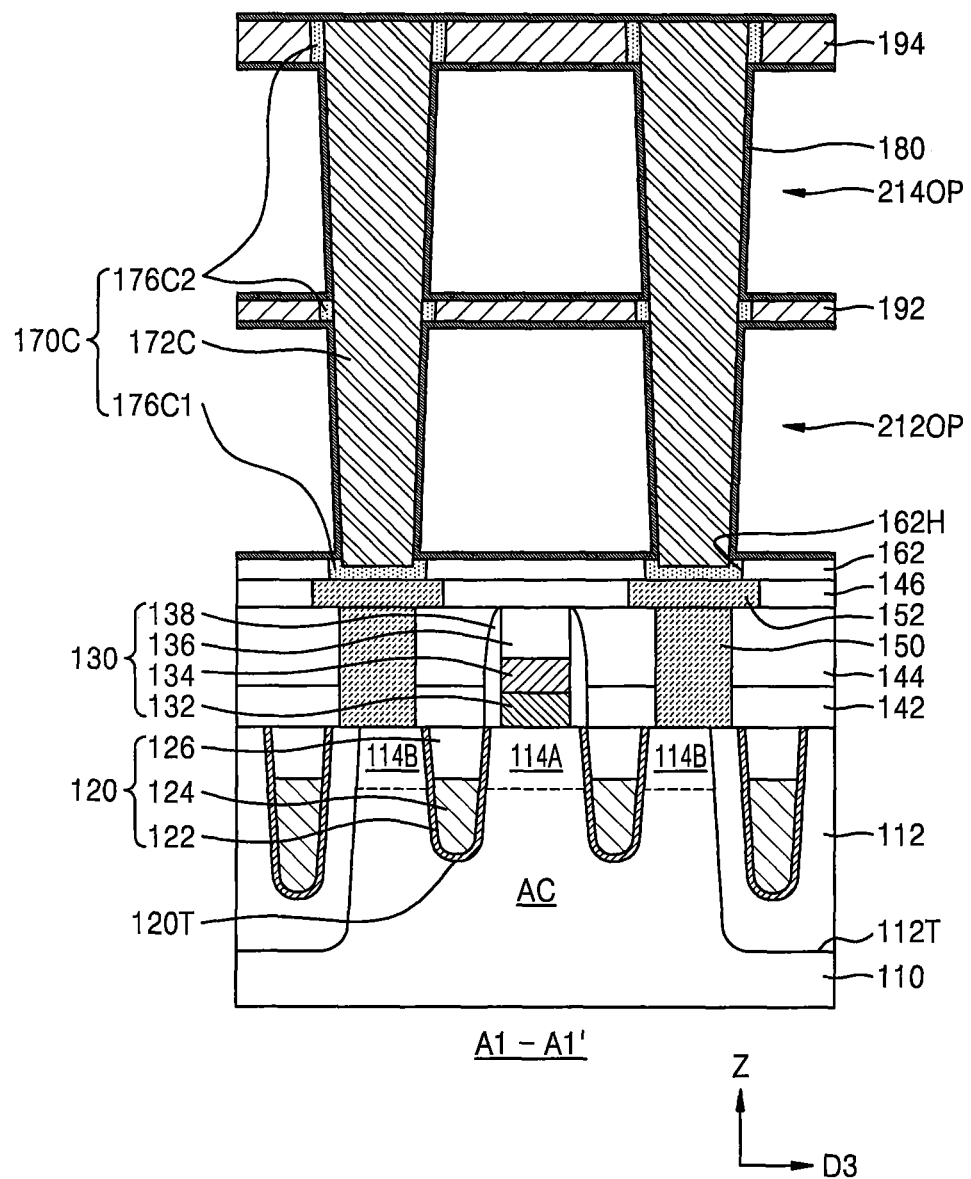

Referring to FIG. 32, the dielectric layer 180 may be formed on the base electrode layer 172C, the first supporter 192, and the second supporter 194. The dielectric layer 180 may be formed by using hafnium oxide, and a portion of the dielectric layer 180, which contacts the top surface and the sidewall of the base electrode layer 172C, may predominantly have a tetragonal crystal phase.

Figure 33:
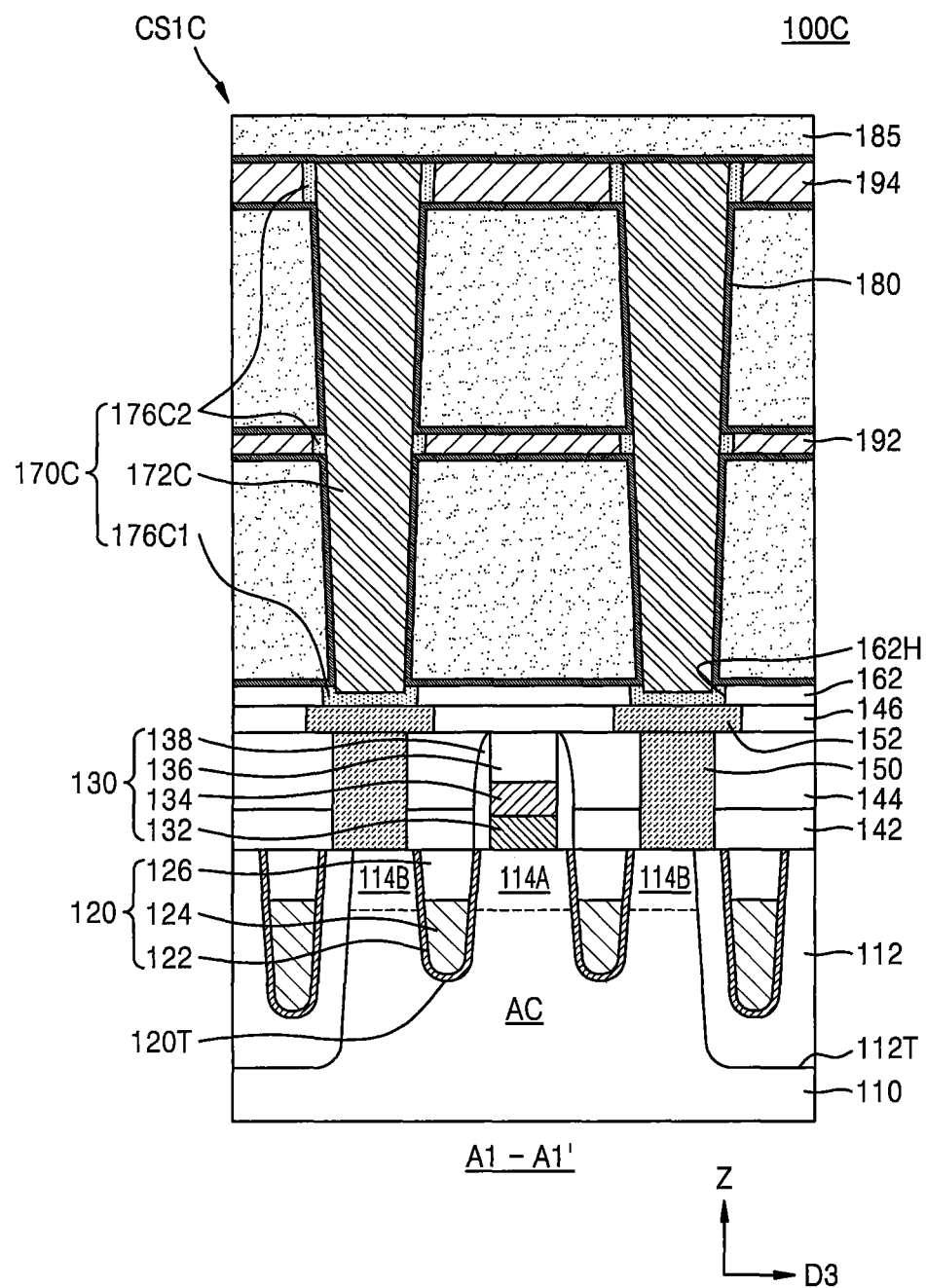

Referring to FIG. 33, the top electrode 185 may be formed on the dielectric layer 180.

FIGS. 34 to 41 are cross-sectional views illustrating sequential processes of a method of manufacturing the integrated circuit device 100D shown in FIGS. 10 and 11, according to some embodiments.

Figure 34:
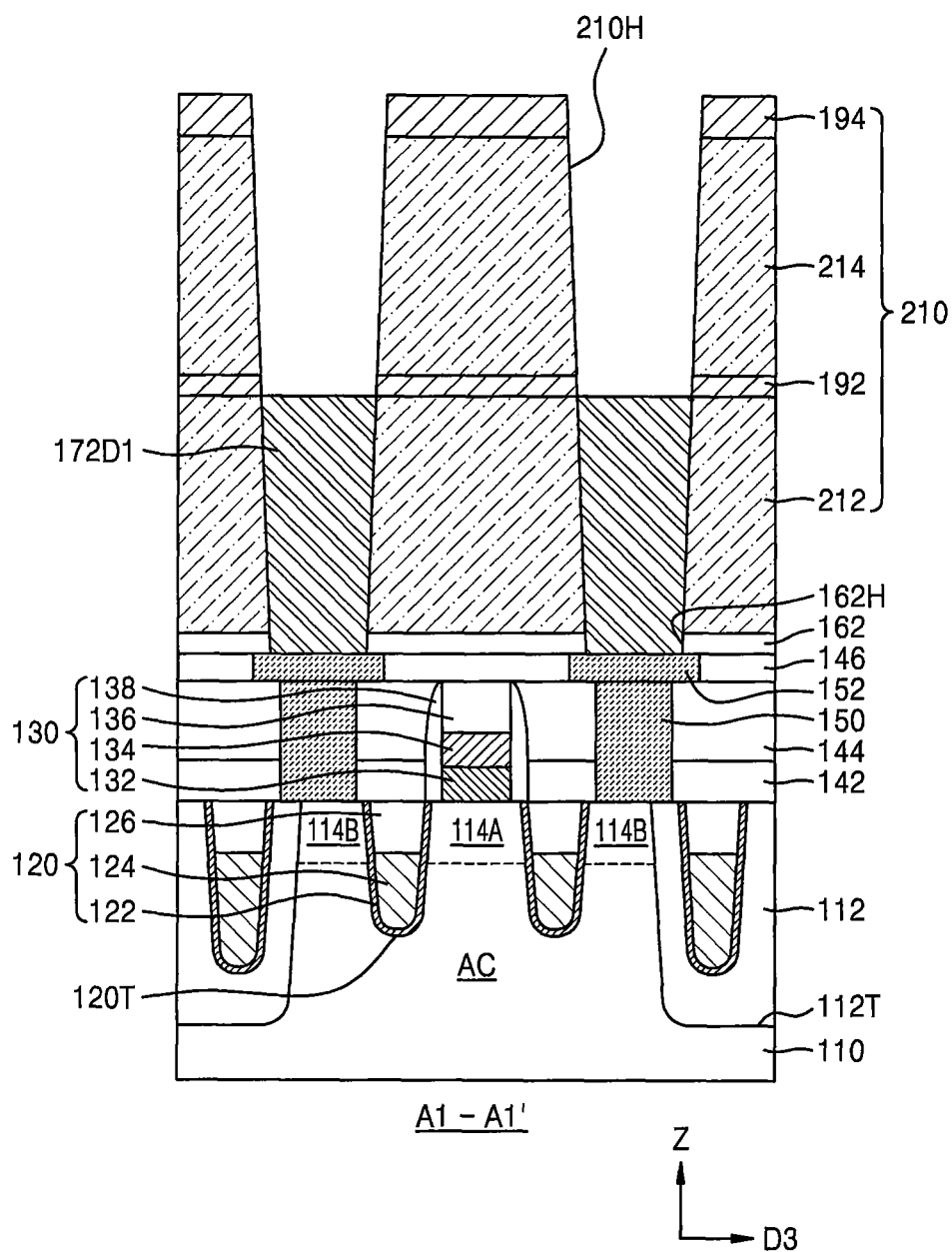
FIGS. 34 to 41 are cross-sectional views illustrating sequential processes of a method of manufacturing an integrated circuit device, according to some embodiments.

Referring to FIG. 34, the first base electrode layer 172D1 may be formed on the landing pad 152 and the mold structure 210 to fill the opening 162H and a lower portion of the opening 210H.

For example, the process of forming the first base electrode layer 172D1 may include an ALD process performed in a bottom-up filling manner by using the exposed top surface of the landing pad 152 as a seed layer and using a niobium halide such as niobium pentafluoride ($NbF_5$) or niobium pentachloride ($NbCl_5$) as a precursor source. In other embodiments, the process of forming the first base electrode layer 172D1 may include an ALD process performed in a bottom-up filling manner by using the exposed top surface of the landing pad 152 as a seed layer and using, as a precursor source, a metal organic precursor including niobium. The process of forming the first base electrode layer 172D1 may be similar to the process of forming the base electrode layer 172, which has been described with reference to FIG. 16.

For example, the first base electrode layer 172D1 may have a top surface at a level that is equal to that of the bottom surface of the first supporter 192. However, the present disclosure is not limited thereto, and the top surface of the first base electrode layer 172D1 may be at a higher or lower level than the bottom surface of the first supporter 192.

Figure 35:
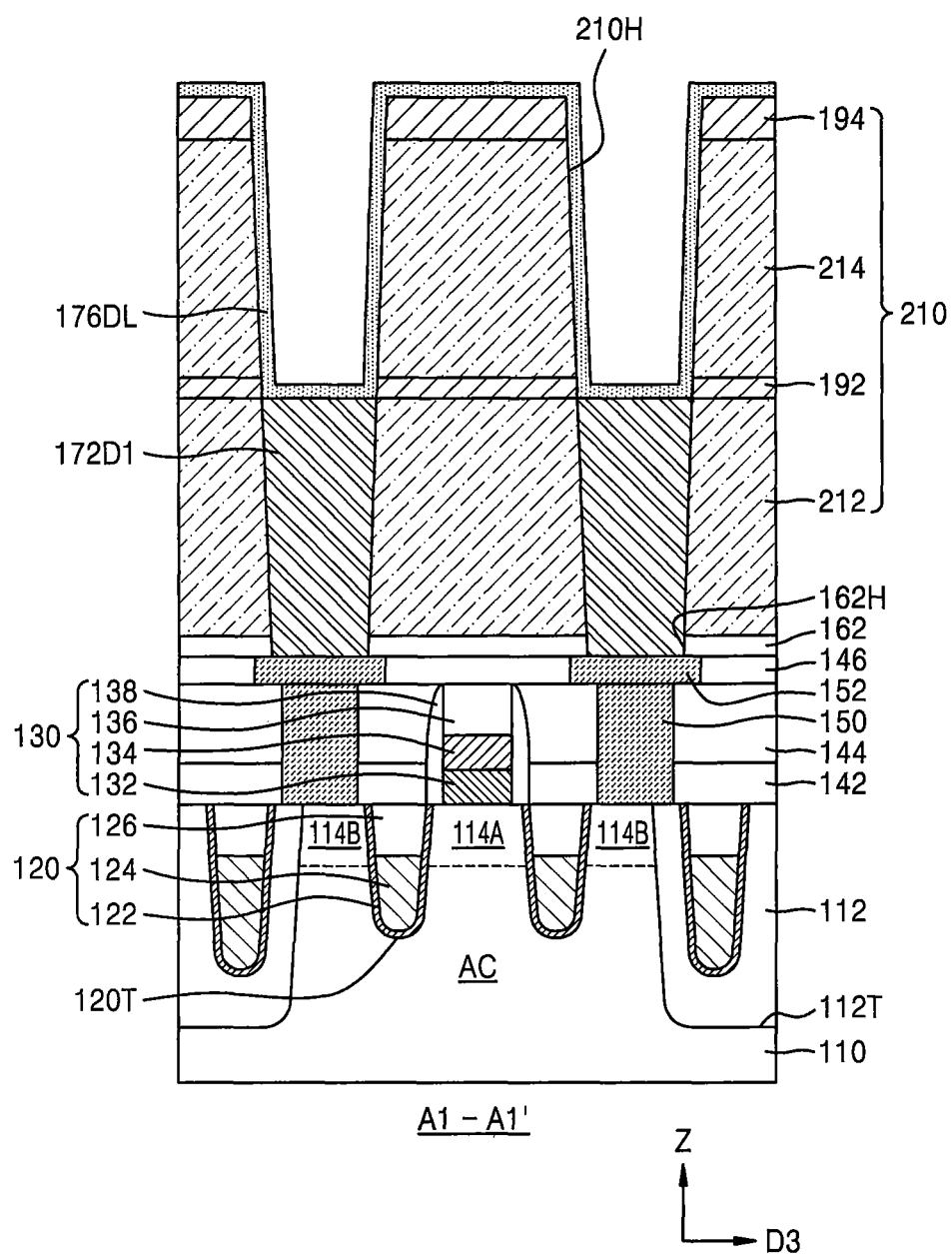

Referring to FIG. 35, the preliminary seed layer 176DL may be formed on the top surface of the first base electrode layer 172D1, the top surface of the mold structure 210, and the sidewall of the opening 210H. The preliminary seed layer 176DL may be formed by a CVD process, an MOCVD process, an ALD process, an MOALD process, or the like by using titanium nitride, tungsten, or the like. The preliminary seed layer 176DL may have a second thickness T12D (see FIG. 11) of about 5 Å to about 200 Å.

Figure 36:
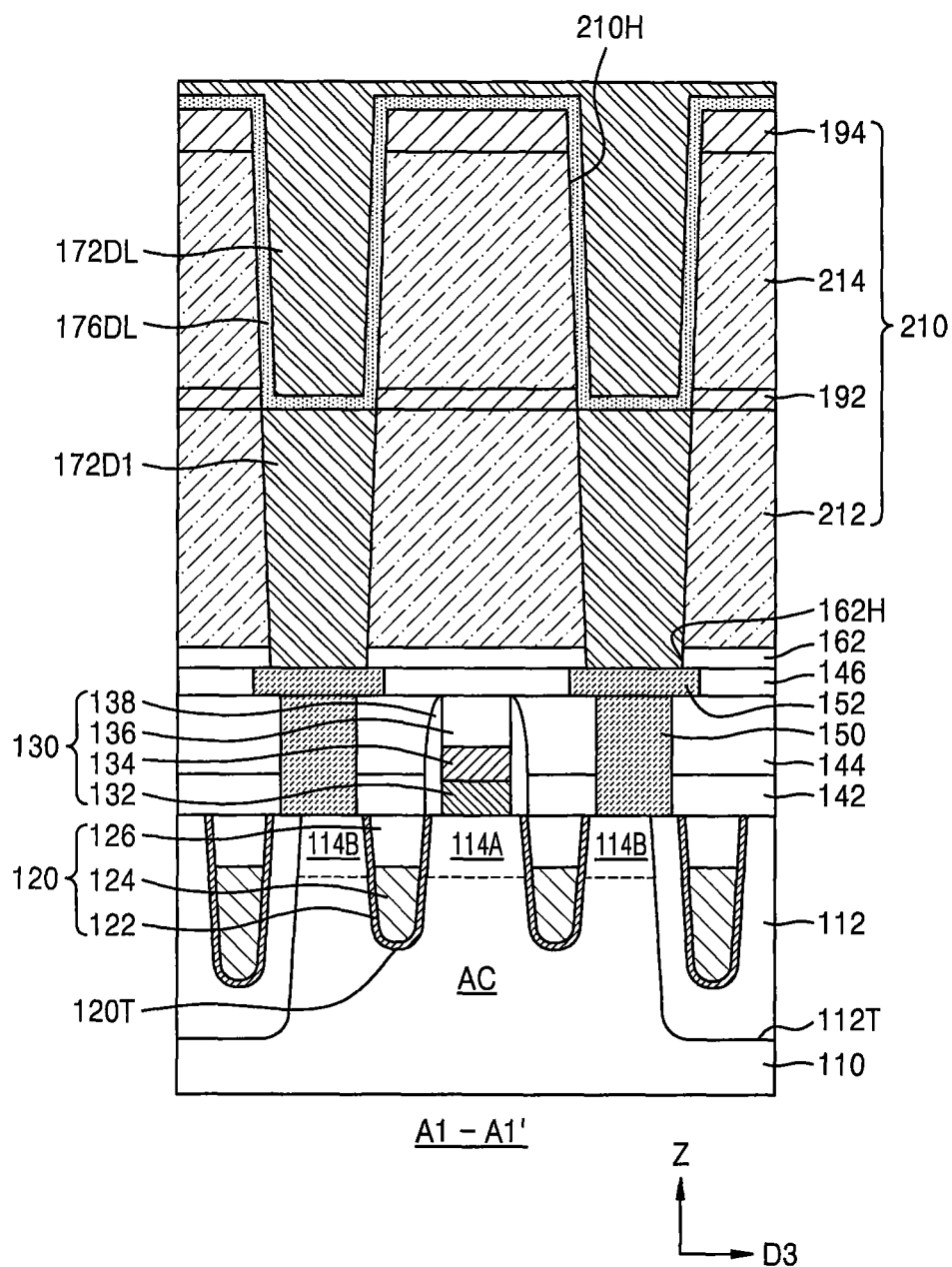

Referring to FIG. 36, a preliminary second base electrode layer 172DL may be formed on the preliminary seed layer 176DL to fill the remaining portion of the opening 210H. The process of forming the preliminary second base electrode layer 172DL may include an ALD process performed in a bottom-up filling manner by using an exposed top surface of the preliminary seed layer 176DL as a seed layer. The process of forming the preliminary second base electrode layer 172DL may be similar to the process of forming the base electrode layer 172, which has been described with reference to FIG. 16.

Figure 37:
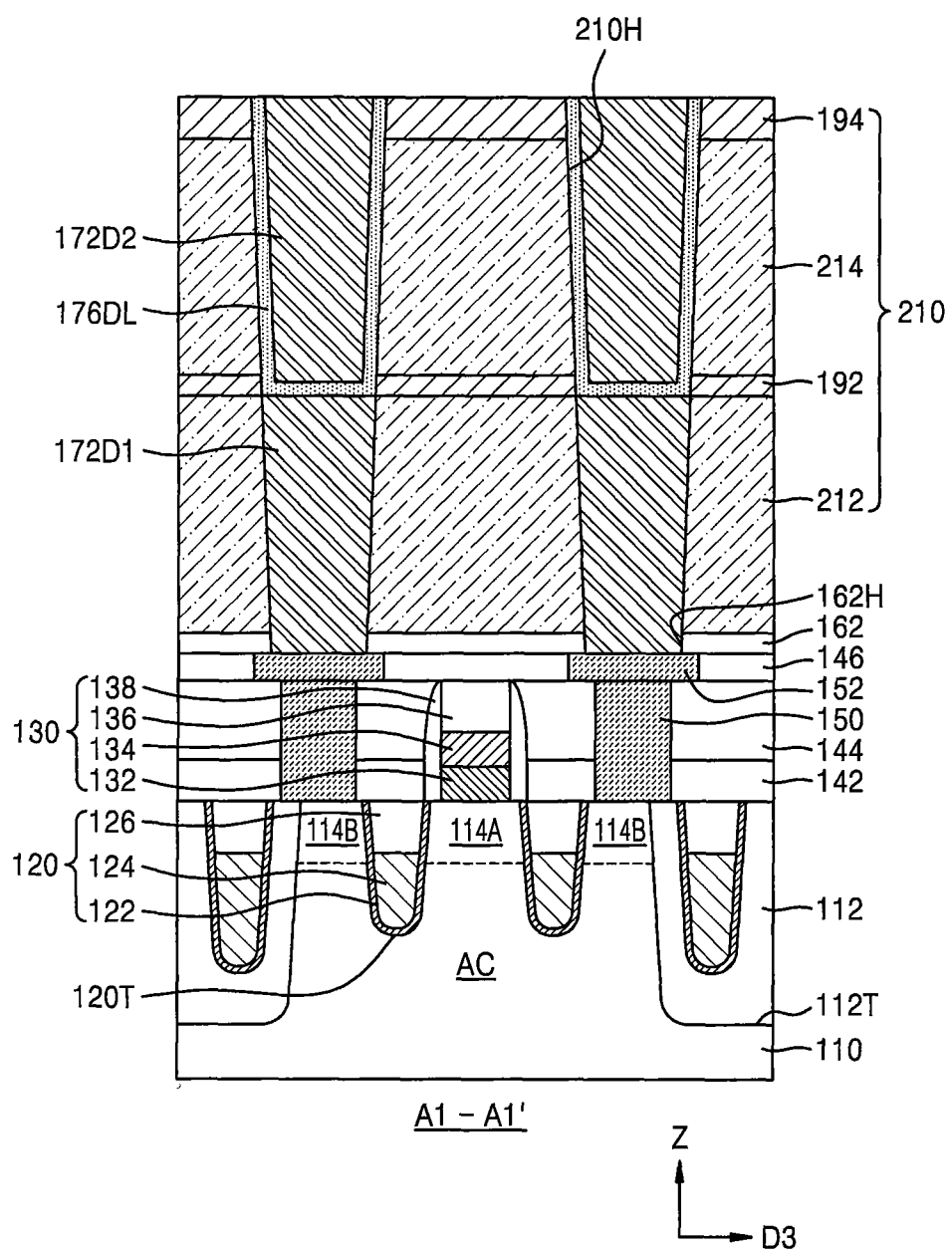

Referring to FIG. 37, upper portions of both the preliminary second base electrode layer 172DL and the preliminary seed layer 176DL may be removed such that the top surface of the second supporter 194 is exposed, thereby separating the second base electrode layer 172D2 in one opening 210H from the second base electrode layer 172D2 in an adjacent opening 210H.

Figure 38:
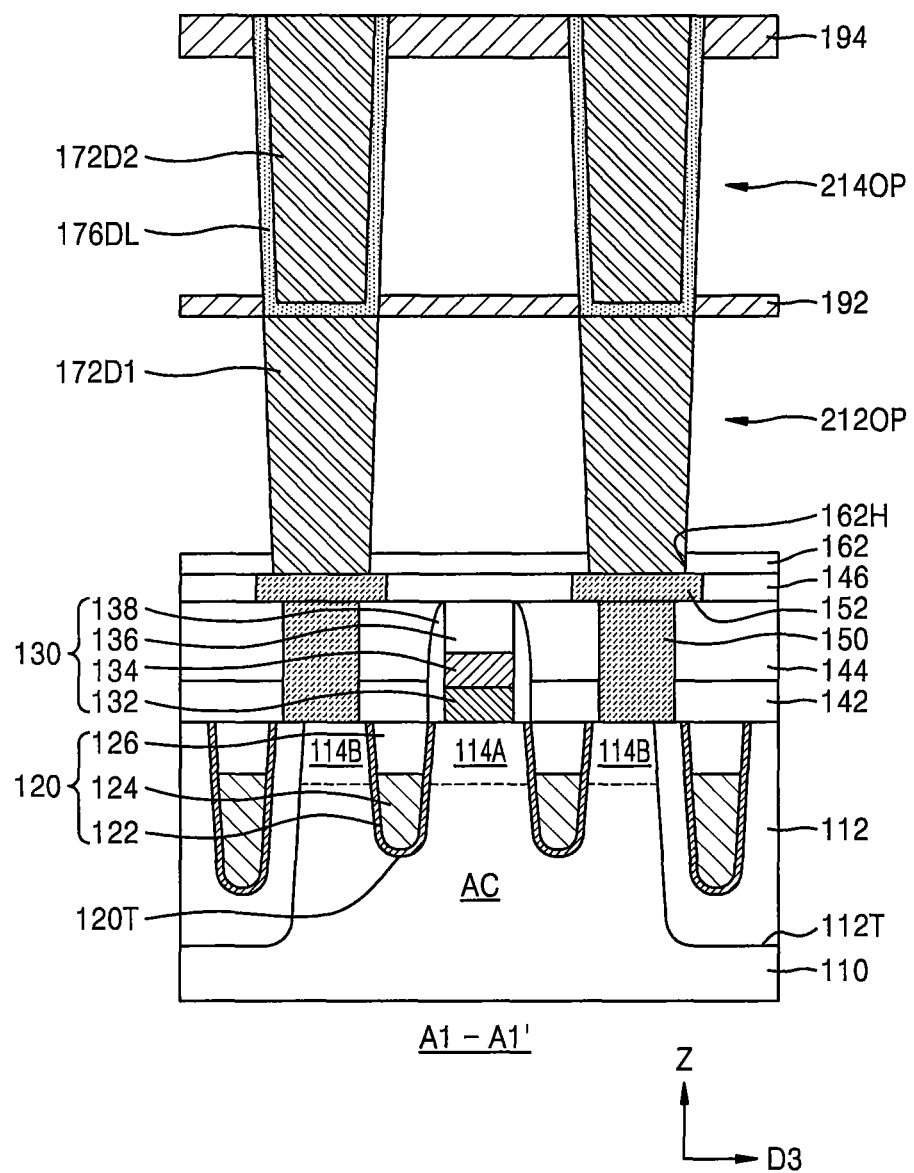

Referring to FIG. 38, the first mold opening 212OP and the second mold opening 214OP may be formed by removing the first mold layer 212 and the second mold layer 214. In the process of removing the first mold layer 212 and the second mold layer 214, the sidewall of the first base electrode layer 172D1 and a sidewall of the preliminary seed layer 176DL may be exposed by the first mold opening 212OP and the second mold opening 214OP.

Figure 39:
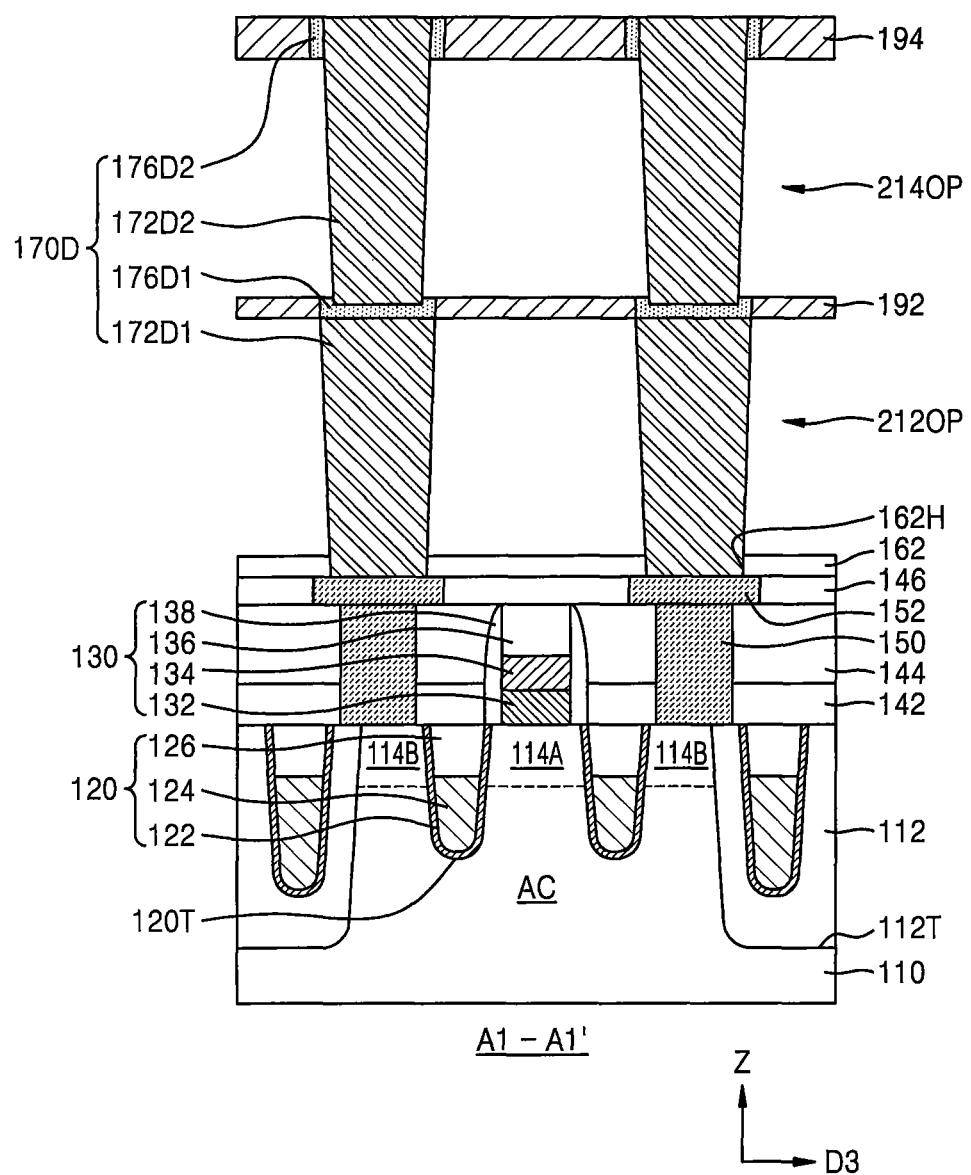

Referring to FIG. 39, a portion of the preliminary seed layer 176DL, which is exposed by the first mold opening 212OP and the second mold opening 214OP, may be removed.

In some embodiments, the process of removing the exposed portion of the preliminary seed layer 176DL may include a wet etching process using an etchant having etch selectivity with respect to the preliminary seed layer 176DL. The sidewall of the second base electrode layer 172D2 may be exposed due to the process of removing the exposed portion of the preliminary seed layer 176DL, and a side portion of the first base electrode layer 172D1 may be scarcely or minimally removed in this removal process.

In the process of removing the exposed portion of the preliminary seed layer 176DL, a portion of the preliminary seed layer 176DL, which is arranged between the top surface of the first base electrode layer 172D1 and a bottom surface of the second base electrode layer 172D2 and surrounded by the first supporter 192, may not be removed. The portion of the preliminary seed layer 176DL, which remains as such, may be referred to as the first seed layer 176D1. In addition, in the process of removing the exposed portion of the preliminary seed layer 176DL, a portion of the preliminary seed layer 176DL, which is arranged between the sidewall of the second base electrode layer 172D2 and the second supporter 194, may not be removed, and this remaining portion of the preliminary seed layer 176DL may be referred to as the second seed layer 176D2.

Figure 40:
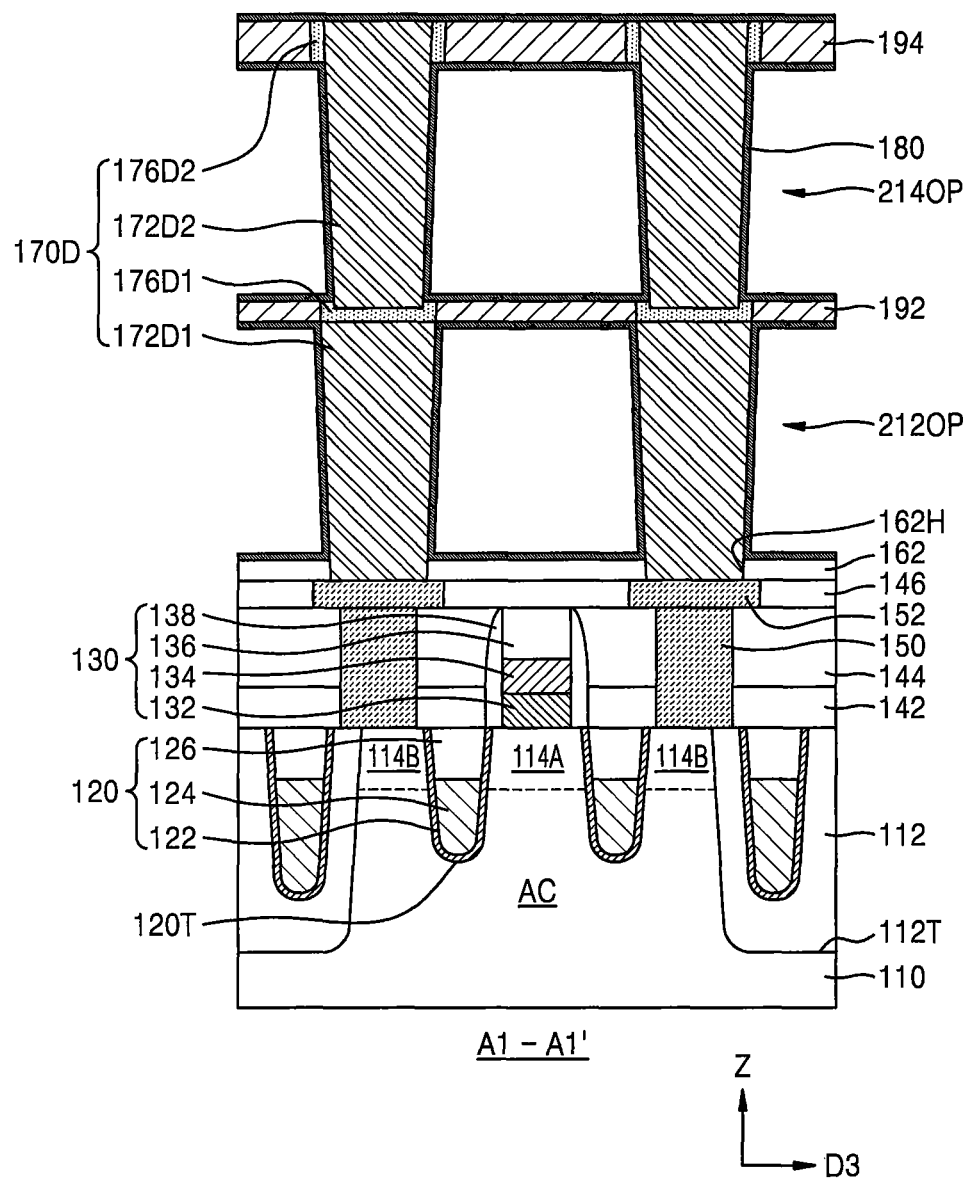

Referring to FIG. 40, the dielectric layer 180 may be formed on the first base electrode layer 172D1, the second base electrode layer 172D2, the first supporter 192, and the second supporter 194. The dielectric layer 180 may be formed by using hafnium oxide, and a portion of the dielectric layer 180, which contacts the sidewall of the first base electrode layer 172D1 and the top surface and the sidewall of the second base electrode layer 172D2, may predominantly have a tetragonal crystal phase.

Figure 41:
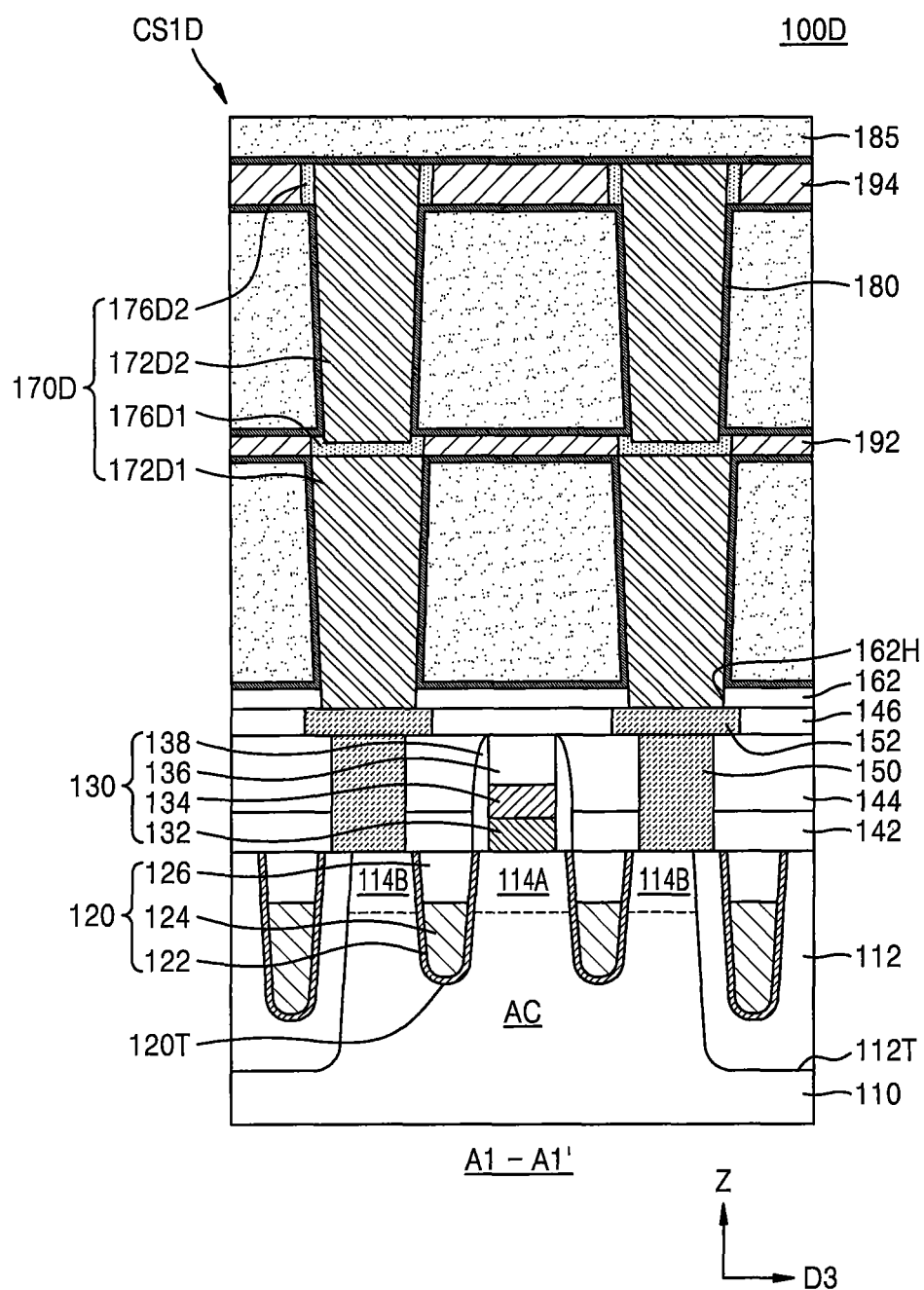

Referring to FIG. 41, the top electrode 185 may be formed on the dielectric layer 180.

Some examples of embodiments of the inventive concepts have been described herein with reference to the accompanying drawings. Although the embodiments have been described by using particular terms, it should be understood that these terms are used for illustrative purposes only and are not to be construed in any way as limiting the present disclosure or the inventive concepts disclosed herein. It will be understood that various modifications, changes, alterations, and equivalent embodiments can be made by those skilled in the art without departing from the scope of the inventive concepts. Therefore, the scope of the inventive concepts should be defined by the accompanying claims and equivalents thereof.

What is claimed is:

1. An integrated circuit device comprising a capacitor structure, wherein the capacitor structure comprises:
    a bottom electrode over a substrate;
    a supporter on a sidewall of the bottom electrode;
    a dielectric layer on the bottom electrode and the supporter; and
    a top electrode on the dielectric layer and covering the bottom electrode,
    wherein the bottom electrode comprises:
        a base electrode layer comprising niobium nitride and extending in a first direction that is perpendicular to a top surface of the substrate;
        a first seed layer surrounded by the supporter and in contact with at least a portion of the base electrode layer; and
        a second seed layer between a bottom surface of the base electrode layer and the substrate, and
    wherein each of the first seed layer and the second seed layer comprises titanium nitride or tungsten.

2. The integrated circuit device of claim 1, wherein the base electrode layer comprises a first sidewall and a second sidewall, wherein the first sidewall of the base electrode layer is surrounded by the first seed layer, and wherein the second sidewall of the base electrode layer is surrounded by the dielectric layer.

3. The integrated circuit device of claim 2, wherein the first sidewall and the second sidewall of the base electrode layer are coplanar.

4. The integrated circuit device of claim 2, wherein the base electrode layer is isolated from the supporter, and wherein the first seed layer is between the first sidewall of the base electrode layer and a sidewall of the supporter.

5. The integrated circuit device of claim 1, wherein the base electrode layer comprises a first base electrode layer; and a second base electrode layer over the first base electrode layer and spaced apart from the first base electrode layer in the first direction,
    wherein the first seed layer is between the first base electrode layer and the second base electrode layer;
    wherein a third seed layer is on a sidewall of the second base electrode layer and surrounded by the supporter, and
    wherein the third seed layer comprises titanium nitride or tungsten.

6. The integrated circuit device of claim 5, wherein the second base electrode layer comprises a first sidewall and a second sidewall, wherein the first base electrode layer comprises a third sidewall, wherein the first sidewall of the second base electrode layer is surrounded by the first seed layer, and wherein the second sidewall of the second base electrode layer and the third sidewall of the first base electrode layer are surrounded by the dielectric layer.

7. The integrated circuit device of claim 6, wherein the first sidewall and the second sidewall of the second base electrode layer are coplanar, and wherein the first sidewall of the second base electrode layer is recessed inwards with respect to the third sidewall of the first base electrode layer.

8. The integrated circuit device of claim 6, wherein the first base electrode layer and the second base electrode layer are isolated from the supporter, and wherein the first seed layer is between the first sidewall of the second base electrode layer and a sidewall of the supporter.

9. The integrated circuit device of claim 6, wherein the third sidewall of the first base electrode layer is coplanar with a sidewall of the supporter.

10. The integrated circuit device of claim 1, wherein a portion of the dielectric layer in contact with the base electrode layer comprises hafnium oxide having a tetragonal crystal phase.

11. An integrated circuit device comprising a capacitor structure, wherein the capacitor structure comprises:
 a landing pad over a substrate;
 a bottom electrode comprising a bottom surface in contact with a top surface of the landing pad;
 a supporter on a sidewall of the bottom electrode;
 a dielectric layer on the bottom electrode and the supporter; and
 a top electrode on the dielectric layer to cover the bottom electrode,
 wherein the bottom electrode comprises a base electrode layer comprising niobium nitride and extending in a first direction that is perpendicular to a top surface of the substrate, and
 wherein a portion of the dielectric layer in contact with the base electrode layer comprises hafnium oxide having a tetragonal crystal phase.

12. The integrated circuit device of claim 11, wherein the base electrode layer is free of seams and voids.

13. The integrated circuit device of claim 11, wherein the base electrode layer comprises a first sidewall and a second sidewall, wherein the first sidewall of the base electrode layer is surrounded by the supporter, wherein the second sidewall of the base electrode layer is surrounded by the dielectric layer, and wherein the first sidewall and the second sidewall of the base electrode layer are coplanar.

14. An integrated circuit device comprising a capacitor structure, wherein the capacitor structure comprises:
 a bottom electrode over a substrate;
 a supporter on a sidewall of the bottom electrode;
 a dielectric layer on the bottom electrode and the supporter; and
 a top electrode on the dielectric layer and covering the bottom electrode,
 wherein the bottom electrode comprises:
  a first base electrode layer comprising niobium nitride and extending in a first direction that is perpendicular to a top surface of the substrate;
  a second base electrode layer over the first base electrode layer and spaced apart from the first base electrode layer in the first direction; and
  a seed layer between the first base electrode layer and the second base electrode layer, the seed layer surrounded by the supporter and having a first sidewall coplanar with the dielectric layer and coplanar with the first base electrode layer.

15. The integrated circuit device of claim 14, wherein the second base electrode layer comprises a first sidewall and a second sidewall, wherein the first sidewall of the second base electrode layer is surrounded by the seed layer, and wherein the second sidewall of the second base electrode layer is surrounded by the dielectric layer.

16. The integrated circuit device of claim 15, wherein the first sidewall and the second sidewall of the second base electrode layer are coplanar.

17. The integrated circuit device of claim 14, wherein the seed layer is a second seed layer, the integrated circuit device further comprising a first seed layer between a bottom surface of the first base electrode layer and the substrate.

18. The integrated circuit device of claim 17, further comprising a landing pad, wherein the first seed layer is between the bottom surface of the first base electrode layer and the landing pad.

* * * * *